(12) United States Patent
Izadi et al.

(10) Patent No.: US 11,001,785 B2
(45) Date of Patent: May 11, 2021

(54) SYSTEMS AND METHODS FOR PARTICULATE REMOVAL USING POLYMERIC MICROSTRUCTURES

(71) Applicant: Yale University, New Haven, CT (US)

(72) Inventors: Hadi Izadi, New Haven, CT (US); T Kyle Vanderlick, Woodbridge, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/772,274

(22) PCT Filed: Oct. 28, 2016

(86) PCT No.: PCT/US2016/059344
§ 371 (c)(1),
(2) Date: Apr. 30, 2018

(87) PCT Pub. No.: WO2017/075365
PCT Pub. Date: May 4, 2017

(65) Prior Publication Data
US 2018/0312784 A1    Nov. 1, 2018

Related U.S. Application Data

(60) Provisional application No. 62/248,834, filed on Oct. 30, 2015.

(51) Int. Cl.
*C11D 3/37* (2006.01)
*B08B 7/00* (2006.01)
(Continued)

(52) U.S. Cl.
CPC .................. *C11D 3/37* (2013.01); *B08B 1/00* (2013.01); *B08B 7/0028* (2013.01); *B23B 5/00* (2013.01);
(Continued)

(58) Field of Classification Search
CPC combination set(s) only.
See application file for complete search history.

(56) References Cited

U.S. PATENT DOCUMENTS

| 4,511,489 A | 4/1985 | Requejo et al. |
| 6,896,741 B2 | 5/2005 | Stelcher |

(Continued)

FOREIGN PATENT DOCUMENTS

| EP | 0967476 A2 | 7/2010 |
| WO | WO 2010/079495 A1 | 7/2010 |

OTHER PUBLICATIONS

PCT International Search Report and Written Opinion for PCT/US2016/059344 dated Jan. 3, 2017.
(Continued)

*Primary Examiner* — Erin F Bergner
(74) *Attorney, Agent, or Firm* — McCarter & English, LLP

(57) ABSTRACT

Systems and methods for removing particles from a surface of a substrate without damage to the substrate are provided. The disclosed systems/methods use polymeric microstructures, e.g., microfibrils, to remove micrometric and sub-micrometric particles from a substrate surface by establishing interfacial interactions with the particles that effectively debond the particles from the surface of the substrate. The disclosed systems/methods have wide ranging applications, including particle removal in art conservation processes, microelectronic applications, optical applications and any other field that stands to benefit from precise removal of particles/dust from a surface without damage to the surface.

23 Claims, 16 Drawing Sheets

(51) Int. Cl.
    *H01L 21/02*     (2006.01)
    *H01L 21/67*     (2006.01)
    *B23B 5/00*     (2006.01)
    *B08B 1/00*     (2006.01)
    *C11D 11/00*     (2006.01)
    *C11D 3/48*     (2006.01)
    *C08K 5/54*     (2006.01)
    *C08L 83/14*     (2006.01)

(52) U.S. Cl.
CPC .......... *C08K 5/5406* (2013.01); *C08L 83/14* (2013.01); *C11D 3/48* (2013.01); *C11D 11/0047* (2013.01); *H01L 21/02041* (2013.01); *H01L 21/67028* (2013.01); *C08L 2203/20* (2013.01); *C11D 3/373* (2013.01)

(56) References Cited

U.S. PATENT DOCUMENTS

| | | | |
|---|---|---|---|
| 2002/0042962 A1 | 4/2002 | Willman et al. | |
| 2003/0005755 A1* | 1/2003 | Schwartz | B82Y 35/00 |
| | | | 73/105 |
| 2004/0086499 A1* | 5/2004 | Caldwell | A61L 27/34 |
| | | | 424/94.1 |
| 2006/0210774 A1* | 9/2006 | Linzell | A47L 13/17 |
| | | | 428/174 |
| 2006/0278825 A1* | 12/2006 | van der Weide | G01Q 60/22 |
| | | | 250/306 |
| 2009/0071506 A1* | 3/2009 | Robinson | B03C 7/006 |
| | | | 134/1.3 |
| 2010/0098941 A1 | 4/2010 | Moon et al. | |
| 2011/0251604 A1* | 10/2011 | Staack | A61B 18/042 |
| | | | 606/32 |
| 2013/0137129 A1* | 5/2013 | Yu | C12N 15/89 |
| | | | 435/29 |
| 2014/0065362 A1* | 3/2014 | Park | C23F 1/02 |
| | | | 428/141 |
| 2014/0252915 A1 | 9/2014 | Su et al. | |
| 2015/0250367 A1 | 9/2015 | Koninklijke | |
| 2015/0378434 A1* | 12/2015 | Baskaran | G06F 3/016 |
| | | | 345/156 |

OTHER PUBLICATIONS

Hansen, et al., Evidence for Self-Cleaning in Gecko Setae, *Proceedings of the National Academy of Science U.S.A.*, 2005, 102, 385-389.

Del Campo, et al., Contact Shape Controls Adhesion of Bioinspired Fibrillar Surfaces, *Langmuir*, 2007, 23, 10235-10243.

Greiner, C., et al., Adhesion of Bioinspired Micropatterned Surfaces: Effects of Pillar Radius, Aspect Ratio, and Preload, Langmuir, 2007, 7, 3495-3502.

Boesel, et al., Inspired Surfaces: A Path to Strong and Reversible Dry Adhesives, *Advanced Materials*, 2010, 22, 2125-2137.

Hu, et al. Dynamic Self-Cleaning in Gecko Setae via Digital Hyperextension, *Journal of the Royal Society Interface*, 2012, 9, 2781-2790.

Hu, et al., Rational Design and Nanofabrication of Gecko, Inspired Fibrillar Adhesives, *Small*, 2012, 8, 2264-2468.

Abusomwan, et al., Mechanics of Load-Drag-Unload Contact Cleaning of Gecko-Inspired Fibrillar Adhesives, *Langmuir*, 2014, 30, 11913-11918.

Menguc, et al., Staying Sticky: Contact Self-Cleaning of Gecko-Inspired Adhesives, *Journal of the Royal Society Interface*, 2014, 11, 20131205, 1-12.

U.S. Appl. No. 62/248,834, filed Oct. 30, 2015.
PCT/US2016/059344, filed Oct. 28, 2016, WO 2017/075365.

* cited by examiner

SYSTEMS AND METHODS FOR PARTICULATE REMOVAL USING POLYMERIC MICROSTRUCTURES

CROSS-REFERENCE TO RELATED APPLICATION

The present application claims priority benefit to a provisional patent application filed in the U.S. Patent Office entitled "Systems and Methods for Particulate Removal Using Polymeric Microfibrils," which was filed on Oct. 30, 2015, and assigned Ser. No. 62/248,834. The entire content of the foregoing provisional patent application is incorporated herein by reference.

BACKGROUND

1. Technical Field

The present disclosure relates to systems and methods for removing particles from a surface of a substrate without damage to the substrate and, more particularly, to systems/methods that use polymeric microstructures to remove micrometric and sub-micrometric particles from a substrate surface by establishing interfacial interactions with the particles that effectively debond the particles from the surface of the substrate. The disclosed systems and methods have wide ranging applications, including particle removal in art conservation processes, microelectronic applications, optical applications and any other field that stands to benefit from precise removal of particles/dust from a surface without damage to the surface.

2. Background Art

Removal of micrometric and sub-micrometric contaminant particles—loosely referred to as dust—from solid surfaces is a critical and exacting challenge in various areas of science and technology, including microelectronics, aerospace, optics, xerography, and adhesive bonding.[1-5] While removal of relatively large (>10 μm) particles from a surface is generally achievable, e.g., by blowing the particles from the surface with a gas jet,[3] removal of smaller (e.g., micrometric and sub-micrometric) particles is usually carried out with wet cleaning techniques, including conventional solvent cleaning methods and more advanced acoustic cleaning approaches.[3, 6]

Although traditional wet cleaning techniques are commonly employed, they present substantial disadvantages and/or limitations, including limited efficiency in removal of sub-micrometric (<0.3 μm) particles, incompatibility with chemical-sensitive materials, re-deposition from contaminated chemicals, environmental damage, and also possible liquid residue on the surface that may cause adhesion of remaining particles.[2, 3] For these reasons, removal of dust particles using dry cleaning techniques (e.g., cleaning with laser beam, microabrasive particles, argon/nitrogen aerosols, and carbon dioxide snow jet) have gained increasing attention in recent decades.[3, 4, 7, 8]

Although dry cleaning approaches do not have many of the drawbacks of the wet cleaning methods, they have one major disadvantage. In particular, previously developed dry cleaning approaches can damage the surface of the substrate upon removal of the surface contaminants.[7, 9] In particular, effective dry cleaning approaches generally rely on energy transfer from an impacting source (e.g., a laser beam or accelerated microparticles) to the contaminant particles, in order to provide a sufficient amount of energy to overcome the dust particles' adhesion to the surface of the substrate.[3, 4] However, the mechanical and thermal stresses associated with detachment of the dust particles from the surface in the noted dry cleaning approaches may also adversely cause damage and even material loss at the surface of the substrate itself.[7, 9]

Thus, despite efforts to date, a need remains for effective techniques for removal of particles, particularly micrometric and sub-micrometric particles, from a surface that does not damage and/or alter the surface. The systems and methods of the present disclosure address the foregoing needs, and overcome the disadvantages/limitations of prior art particle removal techniques.

SUMMARY

The present disclosure provides advantageous systems and methods for removing particulate contamination, e.g., micrometric and sub-micrometric particles, from a solid substrate surface using polymeric microstructures, e.g., microfibrils or micropillars, also known as μ-dusters. The disclosed microstructures, i.e., μ-dusters, are effective in establishing interfacial interactions with the particles to be removed from the surface, thereby debonding the particles from the substrate surface. According to exemplary embodiments of the present disclosure, polymeric microstructures of controlled interfacial and geometrical properties are effective in removing micrometric and sub-micrometric contaminant particles from a solid surface without damaging the underlying substrate. Once these cleaning materials are brought into contact with a contaminated surface, due to their soft and flexible structure, they develop intimate contact with both the surface contaminants and the substrate. While these intrinsically non-sticky cleaning materials have minimal interfacial interactions with the substrate, they produce strong interfacial interactions with the contaminant particles, achieving detachment of the particles from the surface upon retraction of the cleaning material.

Unlike flat substrates of the same material, using microstructures of controlled interfacial and geometrical properties also allows elimination of the adsorbed particles from the contact interface. By moving the adsorbed particles from the tip to the side of the microstructures, e.g., fibrils, and consequently removing them from the contact interface, the disclosed polymeric microstructures are highly effective in cleaning contaminant particles from a surface. Thus, the disclosed systems and methods advantageously facilitate a thorough yet nondestructive cleaning of dust particles from solid surfaces, and demonstrate the benefits offered by micro-structured surfaces in development of interfacially-active materials and devices.

The terms "microstructure" and "μ-duster" are used interchangeably herein. In each case, the terms refer to thread-like or fiber-like structures, generally arranged in an array defining spaces therebetween.

The terms "microfibril" and "micropillar" and the terms "fibril" and "pillar" are also used interchangeably herein. These terms refer to specific implementations of microstructures/μ-dusters, as described herein below.

The disclosed systems/methods are both effective and nondestructive in removing micrometric and sub-micrometric particulate contamination from solid surfaces. The microstructures, e.g., micro-scale fibrillar structures, are generally formed from elastic and low-surface-energy polymeric materials. Once the polymeric microstructures, e.g., microfibrils/micropillars, are brought into contact with a contaminated surface, the soft and flexible characteristics associated with the disclosed microstructures establish intimate contact with both the surface contaminants and the substrate. While these intrinsically non-sticky microstructures, e.g., microfibrils/micropillars, have minimal interfacial interactions with the substrate, development of strong interfacial forces between the disclosed microstructures and the contaminant particles advantageously facilitate detachment of the particles from the surface of the substrate upon retraction/removal of the microstructures therefrom. Of note, the interaction of the disclosed microstructures with the surface of the substrate is so minimal as to impart essentially no physical effect to the surface, thereby preventing damage to the surface in connection with the particle removal process. Indeed, the systems and methods of the present disclosure generally employ microstructures, e.g., microfibril/micropillar, structures of controlled geometrical and interfacial properties which allow elimination/removal of adsorbed micrometric and sub-micrometric particles from the contact interface (e.g., by moving the particles from the tip to the side of the fibrils), thereby effectuating nondestructive cleaning/particle removal.

The disclosed polymeric microstructures offer a new paradigm for thorough cleaning of micrometric and sub-micrometric dust particles from solid surfaces, while leaving the underlying substrate completely intact. The disclosed systems and methods have wide ranging applications, including particle removal in art conservation processes, microelectronic applications, optical applications and any other field that stands to benefit from precise removal of particles/dust from a surface without damage to the surface.

Additional features, functions and benefits of the disclosed systems and methods will be apparent from the description which follows.

BRIEF DESCRIPTION OF FIGURES

To assist those of skill in the art in making and using the disclosed systems and methods, reference is made to the accompanying figures, wherein:

As shown in FIGS. 5.A2, 5.B2 and 5.C2, the head of the µ-duster is smaller than the stem/body of the µ-duster that supports the head; in the µ-duster of FIGS. 5.A2, 5.B2 and 5.C2, the stem/body transitions to the smaller head by way of a circumferential rounded edge.

DESCRIPTION OF EXEMPLARY EMBODIMENTS

As noted above, the present disclosure provides systems and methods for removing particles (e.g., micrometric and sub-micrometric particles) from a surface of a substrate without damage to the substrate. The systems/methods employ polymeric microstructures, e.g., microfibrils/micropillars, that establish interfacial interactions with the particles that permit removal/disassociation of the particles from the substrate without damage to the surface. The disclosed systems and methods have wide ranging applications, including particle removal in art conservation processes, microelectronic applications, optical applications and any other field that stands to benefit from precise removal of particles/dust from a surface without damage to the surface.

Experimental studies have demonstrated the efficacy of polymeric microfibrils for removal of micrometric and sub-micrometric particles without surface damage. In an experimental study, silica particles were used as the contaminants and a poly(methyl methacrylate) (PMMA) thin film was used as the substrate. Fibrillar structures of various geometrical properties (2-50 μm in diameter with aspect-ratios of ~2) were used to remove spherical, mono-disperse silica particles (with nominal diameters of 0.26-7.75 μm) from the surface of PMMA thin films (260±5 nm (n=6) in thickness). The microfibrils were fabricated from an elastic and low-surface-energy polymer, namely, polydimethylsiloxane (PDMS). PDMS was chosen for this purpose because it has low surface energy and high elasticity, properties that minimize the interfacial interactions and mechanical stresses between the cleaning material and the substrate. On the other hand, as an elastic and electrically nonconductive polymer which can develop intimate contact with other surfaces, PDMS can generate strong interfacial interactions with the contaminant particles, stronger than those between the particles and the substrate (PMMA). Having stronger interfacial interactions at the PDMS/silica interface grants the detachment of the contaminant particles from the PMMA surface upon retraction of the cleaning material from the substrate.

Although advantageous implementations and results achievable with the disclosed systems and methods are described herein with reference to exemplary microstructures, e.g., microfibrils fabricated from PDMS that are used for removal of silica particles from a PMMA substrate, it is to be understood that alternative polymeric materials may be used to fabricate microstructures, e.g., microfibrils/micropillars, according to the present disclosure. The disclosed microstructures may be used to remove a range of contaminants from various substrate surfaces, e.g., PMMA substrates/materials, Teflon AF thin films, glass, etc., as will be readily apparent to persons skilled in the art from the description provided herein.

Figure 1:
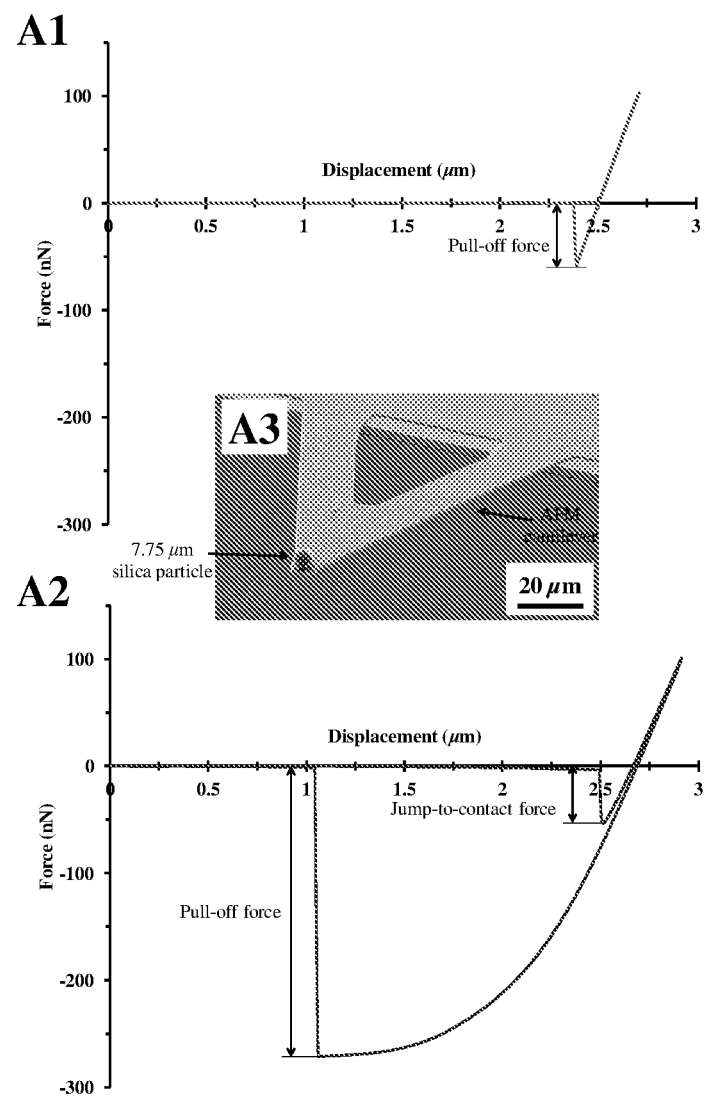
FIG. 1: Typical indentation traces (force vs. displacement) for (A1) a PMMA thin film and (A2) a PDMS flat sheet measured in contact with (A3) a 7.75 µm silica particle which was adhered to a tipless atomic force microscope cantilever.

In order to quantify the interfacial interactions of silica particles with the PMMA substrate and the PDMS microfibrils, the adhesion forces between 7.75 μm silica particles and both PMMA and PDMS were measured using an atomic force microscope. As shown in FIG. 1.A1 and FIG. 1.A2, under a typical preload of 100 nN, the adhesion force ($F_{pull-off}$) between a 7.75 μm silica particle (FIG. 1.A3) and PDMS was 270.6±10.3 nN (n=10), which is about five (5) times larger than the adhesion force between the silica particle and PMMA ($F_{pull-off}$=56.0±4.2 nN (n=10)).

The systems and methods of the present disclosure take advantage of the stronger adhesion forces generated between PDMS/silica particles as compared to adhesion forces between PDMS/PMMA. In particular, it is noted that interfacial interactions at both PDMS/silica and PMMA/silica interfaces are only van der Waals ("vdW"), capillary, and/or electrostatic forces. Van der Waals interactions naturally exist between two materials in contact,[10] while capillary interactions generally become effectual in humid conditions.[10, 11] Electrostatic interactions, on the other hand, can be formed upon contact of any two surfaces, even if the contacted surfaces were electrically neutral in the first place.[12, 13]

The magnitude of the vdW interaction force between two substrates can be determined by using the Hamaker method.[10] Using this method, the vdW-driven adhesion force ($F_{vdW}$) interacting between phase 1 (silica microparticles) and phase 2 (PDMS or PMMA) across medium 3 (air) at the separation distance D can be calculated by $F_{vdW}=-A_{132}R/6D^2$, where R is the radius of the silica microparticles and $A_{132}$ is the Hamaker constant between phase 1 and phase 2, interacting across medium 3.[10] The corresponding Hamaker constant for each contact interface (i.e., PDMS/silica and PMMA/silica interface) can be determined according to the Lifshitz model (Equation 1). Based on this model $$A_{132} \approx \frac{3}{4}kT\left(\frac{\varepsilon_1-\varepsilon_3}{\varepsilon_1+\varepsilon_3}\right)\left(\frac{\varepsilon_2-\varepsilon_3}{\varepsilon_2+\varepsilon_3}\right) + \frac{3h\upsilon_e}{8\sqrt{2}}\frac{(n_1^2-n_3^2)(n_2^2-n_3^2)}{(n_1^2+n_3^2)^{\frac{1}{2}}(n_2^2+n_3^2)^{\frac{1}{2}}\left\{(n_1^2+n_3^2)^{\frac{1}{2}}+(n_2^2+n_3^2)^{\frac{1}{2}}\right\}}$$

Equation 1 where k is Boltzmann's constant, T is the temperature, h is Planck's constant, and $\upsilon_e$ is the electron absorption frequency (typically around $3\times10^{15}$ 1/s).[10] $\varepsilon_1$, $\varepsilon_2$, and $\varepsilon_3$ are the corresponding dielectric constants of phase 1, phase 2, and medium 3, respectively, while $n_1$, $n_2$, and $n_3$ are the refractive indices of phase 1, phase 2, and medium 3, respectively.[10]

Using the Lifshitz model and considering the dielectric constants of PDMS, PMMA, and silica as 2.7,[14] 4.0,[15] and 3.8,[10] respectively, and their refractive indices as 1.41,[14] 1.49,[15] and 1.45,[10] the Hamaker constant for the PMMA/silica contact in dry conditions would be equal to $6.4\times10^{-20}$ J, while that for the PDMS/silica contact would be $5.5\times10^{-20}$ J. Knowing the Hamaker constants of the PDMS/silica and PMMA/silica interfaces and assuming that PDMS and PMMA surfaces (with the roughness average ($R_a$) values of 1.5±0.1 nm (n=5) and 0.8±0.1 nm (n=5), respectively) come into intimate molecular contact with silica particles (i.e., D≈0.3 nm),[10] then according to the Hamaker method, it is expected that PDMS and PMMA develop very close vdW forces ($F_{vdW,PDMS}$=-394 nN while $F_{vdW,PMMA}$=-460 nN).

Other than the Hamaker model, the well-known Johnson-Kendall-Roberts (JKR) model can also be employed to determine the magnitude of the vdW interaction force between two substrates in intimate contact.[16] According to this model, the absolute value of the vdW adhesive force between a 7.75 μm silica particle and PMMA is about -1.1 μN, similar to that between the particle and PDMS ($F_{vdW, PDMS}$=-1.0 μN).

It is clear that theoretically, PDMS and PMMA are expected to develop relatively similar vdW forces upon intimate contact with a 7.75 μm silica particle. Even so, the measured adhesion forces ($F_{pull-off}$) of PDMS were about five times larger than those of PMMA (see FIG. 1.A1 and A2). More importantly, the actual measured adhesion forces ($F_{pull-off}$) of these polymers (270.6±10.3 nN for PDMS and 56.0±4.2 nN for PMMA (n=10)) were significantly smaller than the theoretical $F_{vdW}$ values, which were expected to be developed if vdW interactions were fully functional at the surface of these polymers.

One of the reasons for the adhesion difference between PDMS and PMMA and also for the deviation of the experimental results from the theoretical estimates is the inability of the chosen polymers to develop an intimate molecular contact with silica particles.[17, 18] More specifically, both PDMS and PMMA are required to reach an intimate molecular contact of ~0.3 nm with silica particles in order to achieve the estimated vdW adhesion forces. However, due to natural roughness at the surface of these polymers ($R_{a,PDMS}$=1.5±0.1 nm (n=5); $R_{a,PMMA}$=0.8±0.1 nm (n=5)), achieving this close proximity throughout the entire contact zone, and thus effective vdW interactions at the contact interface, is challenging. In order to elucidate the importance of the effect of the nanoasperities of the surface of these polymers on declining the magnitude of their vdW interfacial forces, the modified Rumpf model (Equation 2) has been employed.[18] According to this model, the vdW interaction force between a smooth spherical particle of radius R (phase 1) and a flat polymeric substrate (phase 2, with root mean square roughness parameter $R_{RMS}$) can be calculated using $$F_{vdW} = \frac{A_{132}R}{6H_0^2}\left[\frac{1}{1+\frac{R}{1.48R_{RMS}}} + \frac{1}{\left(1+\frac{1.48R_{RMS}}{H_0}\right)^2}\right]$$

Equation 2 where $H_0$ is the distance of closest approach between the two surfaces (~0.3 nm).[18] Using Equation 2 and considering that $R_{RMS,PDMS}$=1.9±0.2 nm (n=5) and $R_{RMS,PMMA}$=1.0±0.1 nm (n=5), while assuming that the nanoasperities at the surface of these polymers are not deformable, it is expected that PDMS develops vdW forces of about 4 nN upon contact with a 7.75 μm silica particle, while PMMA should generate vdW forces of about 13 nN at the same contact. From the estimation of vdW interfacial forces by the modified Rumpf model, it is clear that the presence of nanoasperities at the surface of PDMS and PMMA can result in significant decrease in vdW interfacial forces of these polymers. It should be also noted that in the above analysis, for the sake of simplicity, it has been assumed that the surface of the employed silica particles were atomically smooth. Even so, it is expected that the roughness at the surface of silica particles also partly contribute in decreasing the achievable vdW adhesive forces by increasing the actual separation distance between the particles and the polymer surfaces.

While roughness—even at nanometric and sub-nanometric scales—can significantly decrease the ultimate vdW interaction force between two substrates, it is expected that most nanoasperities at the surface of soft materials (like PDMS and PMMA) are squeezed out upon contact with a comparatively more rigid material like silica (with Young's modulus of ~71.7 GPa).[19] Therefore, to shed light on the effect of the mechanical properties of these polymers and, accordingly, the deformation of their surface nanofeatures upon contact with silica particles, the penetration depth (δ) of silica particles into these polymers were calculated using the JKR model. In general, it is expected that all surface asperities with a height equal or smaller than δ values are squeezed out during contact with silica particles.[20] According to the JKR model, the penetration depth of a 7.75 μm silica particle in PMMA and PDMS (under the applied load of 100 nN) is ~3 and 207 nm, respectively. Therefore, by considering that the maximum peak height ($R_P$) for PDMS (30.4±7.9 nm (n=5)) is just one seventh of the particle penetration depth in this polymer, while the penetration depth of the silica particle in PMMA (~3 nm) is smaller than the $R_p$ value for this polymer (5.9±0.5 nm (n=5)), it is clear that, in comparison to PMMA, PDMS should have generated much better intimate contact with silica particles.

On the whole, it can be inferred that vdW-driven adhesion forces of PDMS—upon contact with a 7.75 μm silica particle—changes in the range of 4 to 394 nN, while those of PMMA are between 13 and 460 nN. Analysis of vdW interactions also clearly shows that while PDMS and PMMA theoretically have similar ability in formation of vdW interactions upon contact with silica particles, it is expected that PDMS generates larger vdW forces than PMMA, seeing that it develops better intimate contact in comparison to PMMA.

In contrast to vdW forces, the contribution of capillary forces in the overall interfacial interaction forces ($F_{pull-off}$) of both PDMS and PMMA can be simply neglected. The formation of capillary forces in the current system is very doubtful since experiments were carried out at a relative humidity (RH) of 10±1% (T=20±1° C.), where adsorption of sufficient amounts of water at the contact interface to form capillary bridges is unlikely.[11, 21] Even so, it should be considered that water monolayers still can be adsorbed on the surface of the employed materials (even at this level of humidity), especially the hydrophilic ones.[11, 21] Water monolayers do not produce capillary forces, but they can affect—and particularly decrease—the short-range vdW forces between two contacted surfaces.[21]

From this perspective and in order to ascertain whether water monolayer adsorption is the cause of the significantly smaller adhesion of PMMA in comparison to PDMS, an extreme case where the hydrophobic PDMS/silica interface is presumed to be completely dry (i.e., vdW forces were considered to be in full effect) while a water monolayer is assumed to be present at the hydrophilic PMMA/silica interface (i.e., vdW forces were declined by a monolayer of water), may be evaluated. Considering that a monolayer of water is present at the contact interface between PMMA and silica, the vdW interaction forces still can be calculated by $F_{vdW}=-A_{132}R/6D^2$, but by replacing $A_{132}$ with $A_{eff}$, the effective Hamaker constant of the system. $A_{eff}$ for PMMA/silica can be determined from $A_{eff}=fA_{dry}+\rho f'A_{wet}$,[21] where f is the areal fraction of the silica surface which is in direct contact with the PMMA substrate, while f' is the areal fraction of the silica surface which is in contact with PMMA through a monolayer of water. $A_{wet}$ and $A_{dry}$ are the Hamaker constants in wet and dry conditions, respectively. $\rho$ is the relative water coverage of the surface, which can be calculated by the Langmuir adsorption isotherm as $$\rho = \frac{H}{H+\exp\left(\frac{-E}{kT}\right)} \approx H\cdot\exp\left(\frac{E}{kT}\right) \approx 1.22H \quad \text{Equation 3}$$

where H is the humidity and E is the adsorption energy, which is typically much smaller than the thermal energy (kT) at room temperature.[21] In Equation 3, it may be assumed that for a hydrophilic substrate like PMMA or silica, $E=(A_wA_s)^{1/2}/16\pi \approx 0.2$ kT,[21] where $A_w=3.7\times10^{-20}$ J for water,[10] whereas, according to the Lifshitz model (Equation 1), $A_s$ is equal to $6.0\times10^{-20}$ J for silica and $6.9\times10^{-20}$ J for PMMA. Doing so, the relative water coverage of the surface ($\rho$) for PMMA and silica would be ~0.12. In other words, according to the Langmuir adsorption isotherm, about 12% of the surface of a hydrophilic material (such as PMMA ($\theta_{PMMA}$=82±1° (n=8)) or silica ($\theta_{silica}$=70±20 (n=8))) can get covered with a monolayer of water at RH of 10±1%. Using f'=1.2f for an intimate contact,[21] and knowing that $A_{dry}$=6.4×10$^{-20}$ J and $A_{wet}$=0.8×10$^{-20}$ J for PMMA/silica—according to the Lifshitz model (Equation 1)—the effective Hamaker constant in presence of a monolayer of water for PMMA/silica would be equal to 2.9×10$^{-20}$ J, approximately half of the Hamaker constant of PDMS/silica in dry conditions (5.5×10$^{-20}$ J). Even in this extreme scenario, the Hamaker constant of the dry PDMS/silica interface is only about twice larger than the Hamaker constant of the wet PMMA/silica interface, a significantly lower ratio than the actual five-fold adhesion difference between PDMS and PMMA (see FIGS. 1.A1 and A2). Therefore, it can be concluded that water monolayer adsorption is not the main reason behind the significantly smaller adhesion of silica particles to PMMA in comparison to PDMS, although it may be a minor contributor.

Another cause for the large adhesion difference between PDMS and PMMA upon contact with silica particles can be the difference in electrostatic interactions of these polymers formed via surface charging. In general, when any two—similar or dissimilar—materials touch each other, electric charges transfer from one surface to the other,[12, 22] resulting in the development of a net negative charge on one substrate and a net positive charge on the other.[23] Formation of an electrical double layer at the contact interface via this contact electrification (CE) phenomenon, which is usually more pronounced in the case of insulating materials,[24-26] gives rise to electrostatic interactions between the triboelectrically-charged objects.[12, 13] In order to determine the occurrence of CE and the extent of the electrostatic interactions arising therefrom, the magnitude of electric charges that build up upon contact of silica with both PDMS and PMMA were measured. Because the direct measurement of CE-generated charge densities during adhesion tests with silica microparticles is technically very difficult, due to very small area of contact, contact charge measurements were carried out upon contact with a 25.4 mm diameter polished silica disc ($R_{a,silica}$=1.0±0.1 nm (n=5)).

Using image charge analysis (details can be found in the Experimental section),[12, 13, 27] the absolute value of the surface charge densities formed upon contact of PDMS with silica were found to be 1.5±0.1 mC/m$^2$ (n=10), three times larger than those of PMMA with silica (0.5±0.1 mC/m$^2$ (n=10)). To obtain an approximation of the electrostatic force ($F_{elc}$) that these surface charge densities can produce, the well-known simple capacitor model (Equation 4), which describes the electrostatic interaction force between two charged flat parallel sheets, was employed.[25] According to this model, the magnitude of the electrostatic force ($F_{elc}$) between a flat silica plate and a polymer thin film can be simply determined from[27]

$$F_{elc} = -\frac{a\sigma_s^2}{2\varepsilon_0\varepsilon_r} \quad \text{Equation 4}$$

where a is the area of contact, $\sigma_s$ is the contact surface charge density, $\varepsilon_0$ is the permittivity of free space, and $\varepsilon_r$ is the effective dielectric constant of the contact interface, which can be obtained from[27]

$$\frac{D+d_p+d_{si}}{\varepsilon_r} = \frac{D}{\varepsilon_D} + \frac{d_p}{\varepsilon_p} + \frac{d_{si}}{\varepsilon_{si}} \quad \text{Equation 5}$$

where D is the actual separation distance between the polymer and silica, while $d_p$ and $d_{si}$ are the charge penetration depths in the polymer and silica, respectively.

In Equation 5, $\varepsilon_p$, $\varepsilon_{si}$, and $\varepsilon_D$ are the dielectric constants of the polymer, silica, and separating medium, respectively. Using the simple capacitor model and further assuming the ideal conditions where no charge backflow happens upon retraction of the contacted materials from each other,[12, 13] it was determined that the electrostatic adhesion strength (i.e., adhesion force per unit surface area) of PDMS upon contact with silica is 4.4±0.8 N/cm², which is about nine times larger than that of PMMA (0.5±0.1 N/cm²). With the knowledge of adhesion strength values for PDMS and PMMA and in order to estimate the magnitude of CE-generated electrostatic adhesion forces for contact of these polymers with 7.75 µm silica particles, it is assumed that electric charges are separated only at the contact zone between the particles and the polymers. Doing so, the radius of the charged area for PDMS and PMMA is considered equal to the radius of contact area for these polymers (~1.5 µm for PDMS and ~0.2 µm for PMMA), which have been obtained using the JKR model (details can be found below). By knowing the areas of contact and by approximating the contact interfaces of silica microparticles and the polymers as those between two flat parallel plates, the CE-generated electrostatic forces of PDMS and PMMA upon contact with 7.75 µm silica particles should be approximately 311.0 and 0.6 nN, respectively.

Analysis of CE-generated electrostatic interactions of PDMS and PMMA by the simple capacitor model clearly demonstrates that PDMS generates significantly larger electrostatic adhesion forces in comparison to PMMA. The relatively larger charge densities, and so the CE-driven electrostatic interaction forces of PDMS—which are still typical for an intimate contact—are most likely due to better conformability of this polymer and its propensity in formation of intimate contact with silica particles.[12, 13, 27] While the presence of surface nanofeatures and the ability to develop intimate contact indirectly influence the electrostatic adhesion forces by affecting the surface charge densities, it should be noted that at the current length scales, CE-driven electrostatic forces are independent of the separation distance and, accordingly, the presence of nanoasperities at the surface (see Equation 4). As a result, the effect of interfacial deformations (i.e., deformation of surface nanoasperities of PMMA and PDMS) in the estimated electrostatic adhesion strengths of these polymers has been neglected.

While the simple capacitor model has given an estimate about the CE-generated electrostatic interactions of PDMS and PMMA (~311.0 and 0.6 nN, respectively), finding the exact share of electrostatic forces ($F_{elc}$) in the overall interfacial forces ($F_{pull-off}$) of these polymers upon contact with silica microparticles is technically very challenging, if not impossible. This difficulty is mainly because of uncertainties in finding the area over which charge separation has happened. Unlike vdW forces, CE-driven electrostatic interactions are dependent on the apparent area of contact, specifically, on the area over which charge separation has happened (see Equation 4). While the apparent area of contact can be simply estimated using various contact mechanics models (such as the JKR model employed herein), the area of charging during contact cannot be accurately predicted for many contacts, particularly for those where the area of contact is very small.[28, 29] The reason is that upon contact between two substrates, electric charges can develop outside and around the periphery of the contact zone, as well as inside the contact zone. Although charging outside the contact zone can be practically negligible for macrocontacts, for micro/nanocontacts, this charging can be very important given that the size of the contact area and the charged area for these contacts are significantly different.[28, 29]

Despite the fact that determination of the actual area of charging during contact is not practical, a simplifying assumption can nevertheless be made in order to obtain an approximation of the magnitude of the maximum CE-driven electrostatic forces which can be generated in our system. In particular, for contact between a 7.75 µm silica particle and PDMS or PMMA, the radius of the charged area can be considered equal to the radius of the charged particle (~3.9 µm). This simplifying assumption is not unrealistic, considering that for microcontacts, charging usually takes place in length scales similar to the size of the contacted objects.[28, 29] For instance, upon contact between a ~10 µm spherical probe and a flat PMMA sample, charging over an area of ~10 µm has been reported.[29] Therefore, by approximating the radius of the charged area of our polymers equal to the radius of the charged particles (~3.9 µm), while knowing that electrostatic adhesion strengths of PDMS and PMMA are equal to ~4.4 and 0.5 N/cm², respectively, it can be indicated that the maximum CE-driven electrostatic forces for PDMS and PMMA upon contact with 7.75 µm silica particles should be approximately 2.1 µN and 238.9 µN, respectively.

Overall, analysis of CE-driven electrostatic interactions of PDMS and PMMA indicates that the electrostatic forces of these polymers upon contact with 7.75 µm silica particles should be in the ranges of 311.0 nN-2.1 µN and 0.6-238.9 nN, respectively. Although finding the exact input of CE-generated electrostatic interactions in the overall interfacial interactions of these polymers is very difficult to achieve, similar to vdW forces, analysis of these forces for PDMS and PMMA clearly shows that PDMS is expected to generate significantly larger surface charge densities and accordingly electrostatic adhesion forces in comparison to PMMA. Despite the fact vdW forces of PDMS are also more effective than those of PMMA, it is highly likely that CE-driven electrostatic forces are the main interfacial forces that have allowed PDMS to develop significantly larger adhesion forces in comparison to PMMA. In fact, CE-driven electrostatic interactions are most likely the regulating interfacial interactions in the current system, given that in regular environments where dust cleaning is usually carried out, the electrostatic interactions of micrometric and sub-micrometric particles generally exceed the other physical interfacial forces.[3]

Figure 2:
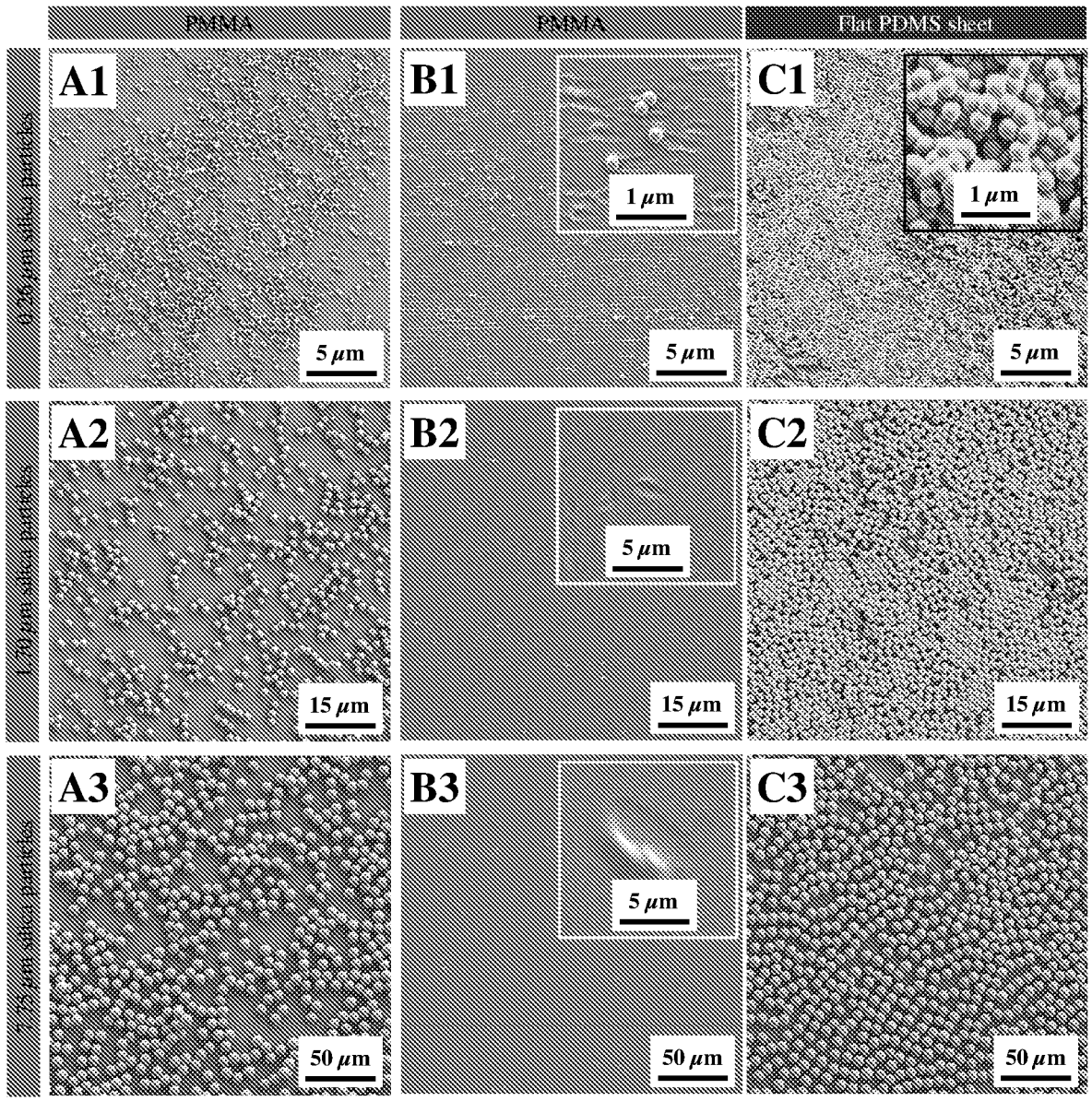
FIG. 2: SEM images from a monolayer of (A1) 0.26, (A2) 1.70, and (A3) 7.75 µm silica particles deposited on PMMA thin films. SEM images from the surface of PMMA thin films contaminated with silica particles, having nominal diameters of (B1) 0.26, (B2) 1.70, and (B3) 7.75 µm, and subsequently cleaned with unstructured PDMS sheets. (C1-C3) SEM images of the surface of unstructured, flat PDMS sheets used to clean B1-B3, respectively.

Given that in comparison to PMMA, PDMS generates stronger interfacial interaction forces with silica particles, regardless of the origin of these interfacial forces, it is expected that even an unstructured, flat PDMS sheet should be able to remove silica particles from the surface of a contaminated PMMA substrate. To test this hypothesis, silica microparticles of different sizes were cleaned from the surface of PMMA thin films by gently tapping unstructured PDMS sheets (used as the control samples) on various spots on the contaminated thin films. FIGS. 2.A1-A3, show the typical scanning electron microscope (SEM) images of a monolayer of 0.26, 1.70, and 7.75 µm silica particles deposited on PMMA thin films, while FIGS. 2.B1-B3 show the same contaminated surfaces after they were cleaned using unstructured PDMS sheets. The strong interfacial interactions of PDMS with silica particles allow unstructured, flat PDMS sheets to remove most of the sub-micrometric and almost all the micrometric contaminant particles from the PMMA substrates. Even so, the accumulation of the particles in localized regions at the surface of the PDMS sheets (see FIGS. 2.C1-C3) result in damaging the surface of the mechanically-delicate PMMA thin films, mostly in the form of small dents. It is worthwhile mentioning that the extent and density of damages formed over PMMA thin films during cleaning by flat PDMS sheets were variant between samples. These variations were expected, given that the extent and density of damages inherently depend on various factors, such as the magnitude of the applied compressive force, duration of its application, variations in the thickness of the PMMA thin films, possible solvent residue in the thin films, mechanical and material properties of the dust particles, and also the hardness of the material beneath the PMMA films.

Figure 3:
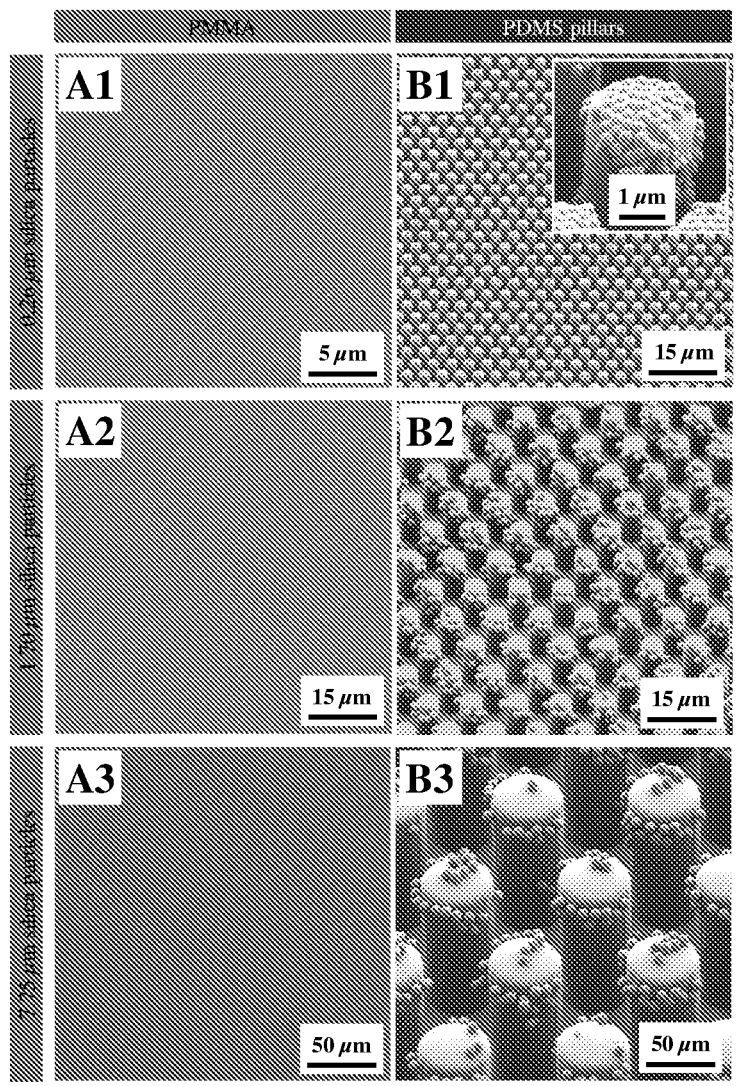
FIG. 3: SEM images from the surface of the contaminated PMMA thin films taken after cleaning (A1) 0.26, (A2) 1.70, and (A3) 7.75 µm silica particles from their surfaces, using PDMS µ-dusters of (B1) 2, (B2) 5, and (B3) 50 µm in diameter, respectively. The SEM images from the µ-dusters were taken from a 45° angle.

Unlike unstructured PDMS sheets, as can be seen in FIGS. 3.A1-A3, PDMS μ-dusters of controlled feature sizes (FIGS. 3.B1-B3) do not cause any visible damage to the surface of the substrate during the cleaning process, while they effectively clean both micrometric and sub-micrometric contaminant particles from the surface. The nondestructive yet effective cleaning performance of PDMS μ-dusters is partly due to the flexible structure of these cleaning materials. The flexibility of the fibrillar cleaning materials make possible the development of intimate contact and therefore, effective interfacial interactions of PDMS μ-dusters with the contaminant particles.[30, 31] Additionally, at macroscale, fibrillar structures exhibiting exemplary geometrical properties as disclosed herein (i.e., flat tips with rounded edges) have been shown to generate smaller adhesion forces in comparison to flat substrates of the same material.[31, 32] In other words, because of the particular geometrical properties of exemplary PDMS μ-dusters disclosed herein, adhesion of these cleaning materials to the substrate is smaller than that of a flat PDMS sheet to the substrate. Consequently, the adhesion-driven mechanical stresses that these μ-dusters may apply to the substrate upon their removal from the surface are also minimized, helping to mitigate the possibility of damage to the surface of the substrate during cleaning.

Figure 4:
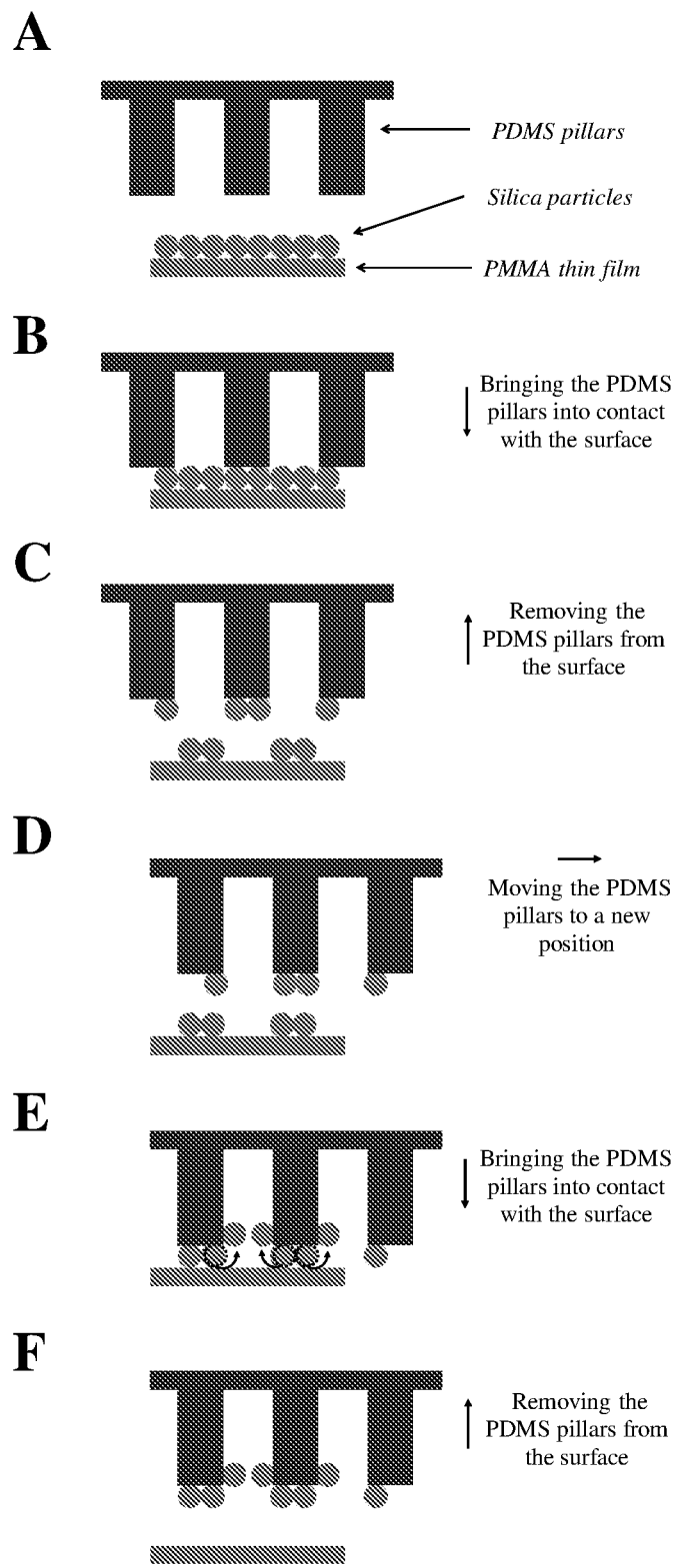
FIG. 4: Schematic representations of cleaning of micrometric and sub-micrometric silica particles from the surface of a PMMA thin film using PDMS micropillars (µ-dusters).

In addition to flexibility and minimal adhesion to the substrate, another significant characteristic which allows the nondestructive cleaning by PDMS μ-dusters is an ability of the disclosed cleaning materials to eliminate the adsorbed particles from the tips of their pillars, and thus from the contact interface. As depicted in FIG. 4.AF, when PDMS μ-dusters come into contact with silica particles (FIG. 4.B), the particles in contact with the tip of the pillars adhere to the cleaning material, due to strong interfacial interactions of PDMS with silica particles. As shown by the arrow in FIG. 4.B, the PDMS μ-dusters are brought into contact with the surface of the substrate supporting the silica particles in a direction that is normal to the surface. Once the pillars are pulled away from the surface, the adhered particles become detached from the substrate (FIG. 4.C). As shown by the arrow in FIG. 4.C, the PDMS μ-dusters are pulled away from the surface of the substrate supporting the silica particles in a direction that is normal to the surface. However, when new particles are brought into contact with the pillars during subsequent cleaning steps (FIG. 4.D), the previously-adsorbed particles move away from the vicinity of the tip of the pillars and roll up the walls of the pillars toward the vacant area between the pillars (FIG. 4.E). This action advantageously prevents accumulation of particles at the contact interface over the course of multiple cleaning steps and, accordingly, decreases the possibility of damaging the substrate during the cleaning process. As shown by the arrows in FIGS. 4.E and 4.F, the PDMS μ-dusters are again brought into contact with and pulled away from the surface of the substrate supporting the silica particles in a direction that is normal to the surface.

Of note, the transfer of particles from the tip of the pillars to the empty space between them also makes possible the employment of small samples of a fibrillar cleaning material to clean large areas of a contaminated substrate. For instance, if the adsorbed particles are effectively moved to the vacant area between the pillars and get closely packed in that space, geometrical analysis indicates that a 1 cm² sample of 50 μm PDMS μ-dusters should be able to clean over 9 cm² area of a substrate contaminated with a monolayer of 7.75 μm silica particles. However, the present disclosure is not limited by or to such sizing and/or contaminant-capture capacity. Rather, the noted geometrical analysis is merely illustrative of the effectiveness of the systems and methods of the present disclosure in capturing significant amounts of contaminants in an efficient and effective manner.

Figure 5:
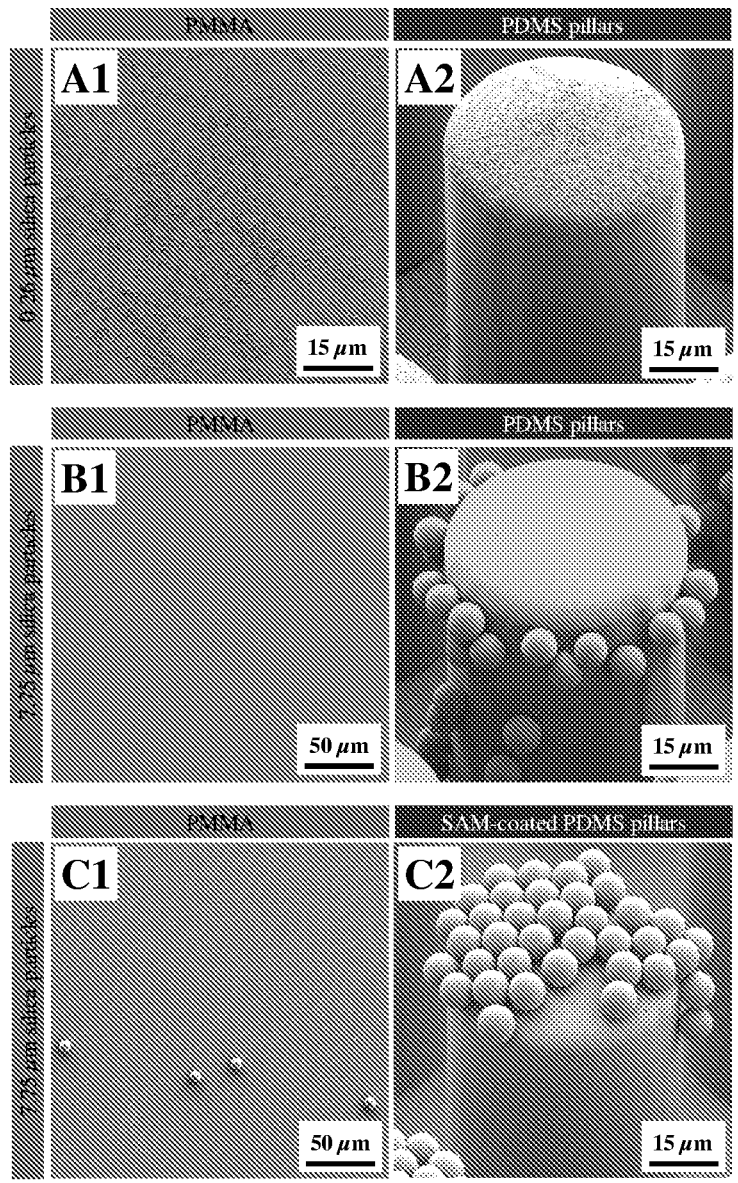
FIG. 5. (A1) SEM image taken from the surface of a PMMA thin film which was contaminated with 0.26 µm silica particles and subsequently cleaned using (A2) 50 µm PDMS µ-dusters. (B1) Effective and nondestructive cleaning of a PMMA thin film after removing 7.75 µm silica particles from its surface by using (B2) 50 µm PDMS µ-dusters. (C1) Unlike uncoated PDMS µ-dusters, 50 µm, FOTS-coated PDMS µ-dusters cannot remove all 7.75 µm silica particles from the surface of a PMMA thin film because (C2) the adsorbed particles cannot leave the vicinity of the tip of the FOTS-coated PDMS pillars. The SEM images from the µ-dusters were taken from a 45° angle.

According to exemplary embodiments of the present disclosure, the disclosed microstructures may be characterized by certain geometrical properties. In particular, the diameter of the cleaning pillars ($d_{Pi}$) should generally not be excessively larger than the diameter of the contaminant particles ($d_{Pa}$). For instance, as can be seen in FIG. 5.A1, a PMMA substrate contaminated with 0.26 μm particles cannot be entirely cleaned with 50 μm PDMS μ-dusters. Since the size of the employed pillars is much larger than that of the particles ($d_{Pi}/d_{Pa} \approx 192$), the adsorbed particles are not expelled from the tip of the pillars upon multiple contacts (see FIG. 5.A2). In this case, the tip of each pillar is acting as a flat substrate; limited space at the tip leads to the saturation of the tip with the relatively small particles (FIG. 5.A2), preventing contact between the remaining particles on the contaminated substrate and the cleaning material. Notably, the cleaning efficiency of these large micropillars in removing sub-micrometric particles is even lower than that of a flat substrate (compare FIGS. 2.B1 with 5.A1), because the effective contact area of the hexagonally-patterned PDMS micropillars—with a wall-to-wall distance equal to the diameter of each pillar—is ~39% of that of a flat PDMS sheet.

According to experimental studies in systems with $d_{Pi}/d_{Pa}$ values of approximately 3, 6, 8, 12, 20, and 192, it can be concluded that when the pillar diameter is less than approximately eight times larger than the particle diameter (i.e., $d_{Pi}/d_{Pa} \leq \sim 8$), the adsorbed particles are effectively removed from the tip of the cleaning pillars, allowing effective and nondestructive cleaning of the contaminant particles from the substrate. This is evident in FIG. 5.B1, which shows the successful removal of 7.75 μm particles from the PMMA substrate by 50 PDMS μ-dusters, which were demonstrated to be ineffective in fully cleaning sub-micrometric particulate contaminations of 0.26 μm from the same substrate (see FIG. 5.A1). As can be seen in FIG. 5.B2, at $d_{Pi}/d_{Pa}$ of ~6, the relatively large, 7.75 μm particles leave the vicinity of the tip of the pillars upon multiple contacts and as a result, the contaminant particles can be successfully transferred from the surface of the substrate to the surface of the cleaning material, while there is no visible damage at the surface of the cleaned substrate.

According to the present disclosure, migration of particles from the microstructure tip to the wall not only depends on the geometrical properties of the microstructures, e.g., microfibrils/micropillars, but also on their interfacial properties. The disclosed microstructures must develop strong interfacial interactions with the contaminant particles in order to be able to remove them from the substrate in the disclosed systems/methods. However, if the adsorbed particles stick very strongly to the tip of the pillars, their movement away from the tip upon multiple contacts will be limited and, as a result, complete cleaning of the substrate with these pillars may not be achieved.

In an experimental study, the interfacial interactions at the surface of PDMS µ-dusters were enhanced by improving their tendency in generating CE-driven electrostatic forces. To do so, 50 PDMS µ-dusters were coated with a self-assembled monolayer (SAM) of a fluorine-based silane coupling agent (perfluorooctyltrichlorosilane, FOTS). As can be seen in FIG. 5.C1, the PMMA surface contaminated with 7.75 µm silica particles can only be partially cleaned by using these comparatively stickier SAM-coated PDMS µ-dusters. In this case, because of the strong interfacial interactions of FOTS-coated µ-dusters with the adsorbed microparticles, the particles are not expelled from the tips of the pillars of these cleaning materials (FIG. 5.C2). Therefore, due to the limited effective contact area of the employed fibrillar structure (~39% of a flat surface), only partial cleaning was achieved by using these relatively stickier micropillars.

Unlike uncoated PDMS pillars, FOTS-coated PDMS pillars cannot remove the adsorbed particles from their tips because of the stronger interfacial interactions of FOTS-coated µ-dusters in comparison to uncoated PDMS µ-dusters. More specifically, by coating the PDMS surface with a FOTS SAM, the overall adhesion force ($F_{pull-off}$) required to detach a 7.75 µm silica particle from the cleaning material was increased to 310.9±14.5 nN (n=10) for FOTS-coated PDMS (FIG. 6.A), from 270.6±10.3 nN (n=10) for PDMS (FIG. 1.A2). The stronger adhesion of FOTS-coated PDMS µ-dusters in comparison to uncoated PDMS µ-dusters is not because of the changes in the vdW interaction forces caused by SAM coating, given that FOTS coating decreases the magnitude of the van der Waals interaction forces at the surface of PDMS. For instance, by coating the surface of PDMS with a FOTS layer, the van der Waals-driven jump-to-contact adhesion force $(F_{jtc})$[37]—upon contact with a 7.75 µm silica particle—dramatically drops from 50.9±4.3 nN (n=10) for PDMS to 5.3±2.8 nN (n=10) for FOTS-coated PDMS (see FIGS. 1.A2 and 6.A).

In general, between two smooth materials of similar mechanical properties, the material with stronger vdW interactions usually generates larger jump-to-contact adhesion forces. With FOTS-coated PDMS generating smaller jump-to-contact adhesion forces in comparison to PDMS, while being even softer than PDMS (Young's modulus of PDMS=2.7±0.3 MPa (n=10); Young's modulus of FOTS-coated PDMS=0.3±0.1 MPa (n=10)), it is clear that coating the PDMS surface by FOTS has decreased the magnitude of the vdW interaction forces at the surface of PDMS.

Figure 6:
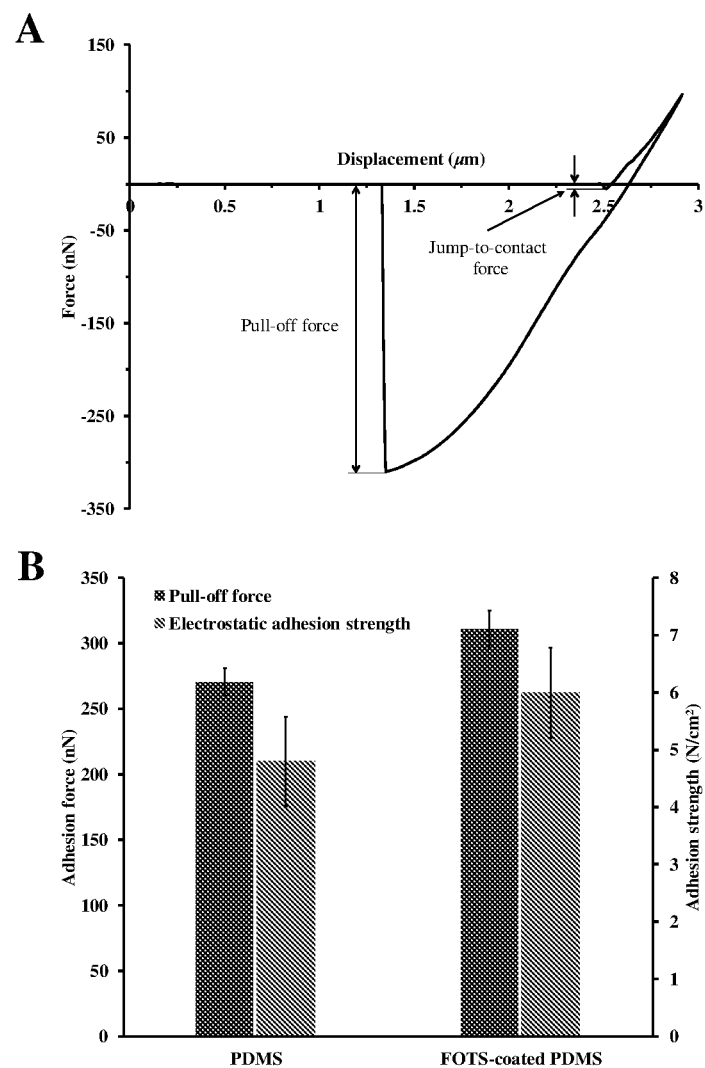
FIG. 6: (A) Typical—force vs. displacement—indentation plot for a flat FOTS-coated PDMS sheet in contact with a 7.75 µm silica particle. (B) The total pull-off force measured for contact of both PDMS and FOTS-coated PDMS with a 7.75 µm silica particle. The Electrostatic adhesion strengths for contact of uncoated and SAM-coated PDMS with silica were estimated from the charge measurement results, using the simple capacitor model.

In addition to reducing van der Waals interaction forces, FOTS coating also slightly decreases the propensity of the PDMS surface for forming capillary interactions, given that FOTS-coated PDMS is slightly more hydrophobic than PDMS itself ($\theta_{FOTS-PDMS}$=111±1°>$\theta_{PDMS}$=108±1°; (n=8)) [10, 11, 21] While FOTS SAM reduces the affinity to generate both van der Waals and capillary interactions, like other SAMs, it can improve the surface charging, and as a result, surface electrostatic interactions.[13, 38, 39] In particular, by coating the surface of PDMS with FOTS, the CE-generated surface charge densities increased from 1.5±0.1 mC/m² (n=10) for PDMS to 1.8±0.1 mC/m² (n=10) for FOTS-coated PDMS. According to the simple capacitor model (Equation 4) and as depicted in FIG. 6.B, even this slight increase in surface charging can result in significant enhancement of CE-electrostatic adhesion strengths from 4.4±0.8 N/cm² for PDMS to 6.0±0.8 N/cm² for FOTS-coated PDMS, which reasonably matches the experimental adhesion measurement results.

In summary, the disclosed systems and methods are effective in removing particulate contamination from solid surfaces using conformal, polymeric fibrillar microstructures. The CE-driven interfacial interactions of the fabricated micropillars with the contaminant particles allow complete or substantially complete and effective removal of micrometric and sub-micrometric particles from the surface of the substrate. Unlike unstructured, flat sheets of the same material, polymeric µ-dusters do not cause any visible damage to the surface of the substrate. The cleaning performance of the fibrillar cleaning materials relies on the geometrical and interfacial properties of the fabricated micropillars, allowing the removal of the adsorbed particles away from the tip of the pillars and, accordingly, the contact interface, helping to achieve nondestructive, but effective cleaning.

Figure 7:
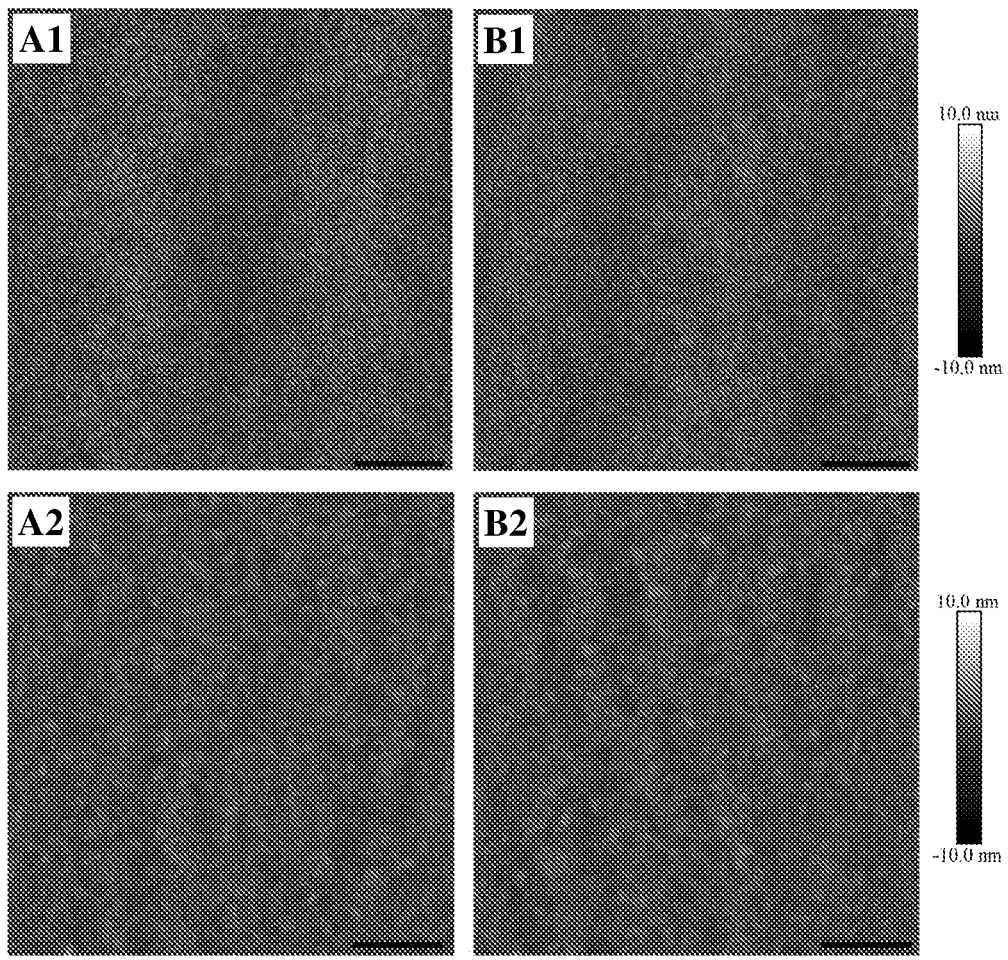
FIG. 7: Demonstration of the nondestructive cleaning performance of PDMS µ-dusters by characteristic atomic force microscopy (AFM) images taken at different magnifications from fixed spots on the surface of a contaminated PMMA thin film (A1 and A2) before soiling the surface with 7.75 µm silica particles and (B1 and B2) after cleaning the surface using 50 PDMS µ-dusters (scale bars: 1.0 µm for A1 and B1 and 4.0 µm for A2 and B2). 7.75 µm silica particles were chosen for AFM analysis since they could damage the PMMA thin films in larger areas (see FIG. 8.B), so damages caused by these particles were easier to track using AFM. AFM analysis was performed at four fixed spots over each sample, while the AFM tests at each magnification were individually replicated three times. Test spots for each sample (i.e., a 22×22 mm² PMMA thin film) were located at corners of a square (which was marked under the glass coverslip before preparing the thin film) with a side length of ~7 mm at the center of the sample. Even though—after cleaning—locating the exact place where AFM images were previously taken was not very efficient, similarity of the average of the $R_a$ values of the samples (measured at multiple fixed spots both before cleaning ($R_{a,before}$=0.6±0.1 nm (n=12) for 5×5 µm² tests and $R_{a,before}$=0.7±0 0.2 nm (n=12) for 20×20 µm² tests) and after cleaning ($R_{a,after}$=0.5±0.1 nm (n=12) for 5×5 µm² tests and $R_{a,after}$=0.6±0.1 nm (n=12) for 20×20 µm² tests) confirms the nondestructive performance of PDMS µ-dusters in removing silica particles from the surface of PMMA thin films.
Figure 8:
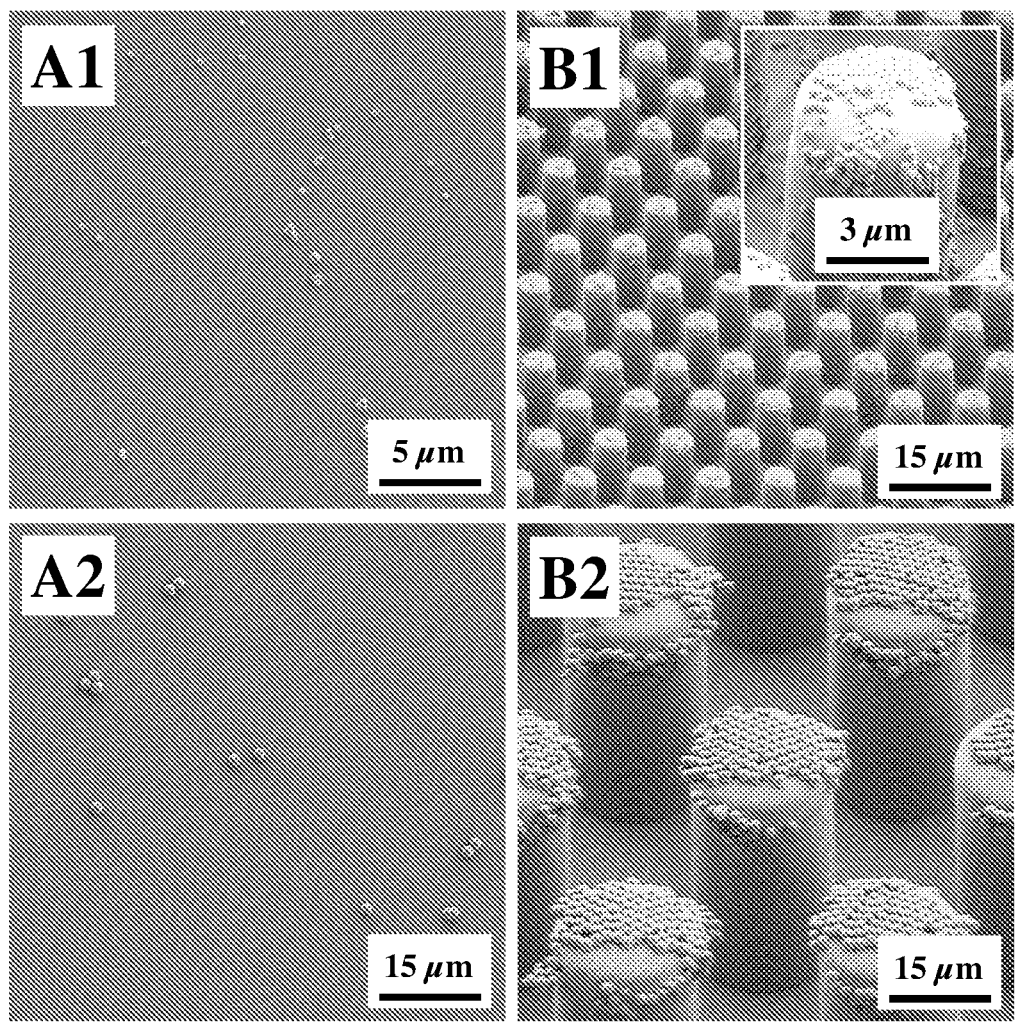
FIG. 8: Scanning electron microscope (SEM) images from the surface of contaminated PMMA thin films taken after cleaning (A1) 0.26 and (A2) 1.70 µm silica particles from their surfaces, using PDMS µ-dusters of (B1) 5 and (B2) 20 µm in diameter, respectively. The SEM images from the µ-dusters were taken from a 45° angle.

The effective cleaning performance of the disclosed polymeric microstructures is demonstrated by the AFM images from contaminated PMMA thin films taken before and after cleaning set forth in FIG. 7, as well as additional SEM images from the contaminated substrates and the cleaning materials taken after cleaning set forth in FIG. 8.

More particularly, the images in FIG. 7 demonstrate nondestructive cleaning performance of PDMS µ-dusters taken by characteristic atomic force microscopy (AFM) at different magnifications from fixed spots on the surface of a contaminated PMMA thin film (A1 and A2) before soiling the surface with 7.75 µm silica particles and (B1 and B2) after cleaning the surface using 50 µm PDMS µ-dusters (scale bars: 1.0 µm for A1 and B1 and 4.0 µm for A2 and B2). 7.75 µm silica particles were chosen for AFM analysis since they could damage the PMMA thin films in larger areas, so damages caused by these particles were easier to track using AFM. AFM analysis was performed at four fixed spots over each sample, while the AFM tests at each magnification were individually replicated three times. Test spots for each sample (i.e., a 22×22 mm² PMMA thin film) were located at corners of a square (which was marked under the glass coverslip before preparing the thin film) with a side length of ~7 mm at the center of the sample. Even though—after cleaning—locating the exact place where AFM images were previously taken was not efficient, similarity of the average of the $R_a$ values of the samples (measured at multiple fixed spots both before cleaning ($R_{a,before}$=0.6±0.1 nm (n=12) for 5×5 µm² tests and $R_{a,before}$=0.7±0.2 nm (n=12) for 20×20 µm² tests) and after cleaning ($R_{a,after}$=0.5±0.1 nm (n=12) for 5×5 µm² tests and $R_{a,after}$=0.6±0.1 nm (n=12) for 20×20 µm² tests) confirms the nondestructive performance of PDMS µ-dusters in removing silica particles from the surface of PMMA thin films.

With reference to FIG. 8, scanning electron microscope (SEM) images are provided from the surface of contaminated PMMA thin films taken after cleaning (A1) 0.26 and (A2) 1.70 µm silica particles from their surfaces, using PDMS µ-dusters of (B1) 5 and (B2) 20 µm in diameter, respectively. The SEM images from the µ-dusters were taken from a 45° angle and clearly demonstrate the effectiveness of the systems/methods of the present disclosure.

EXPERIMENTAL RESULTS

1. Experimental Procedure—First Experimental Regimen

Polydimethylsiloxane (PDMS), as two-part Sylgard 184 Silicone Elastomer Kit, was acquired from Dow Corning. Poly(methyl methacrylate) (PMMA, average molecular weight ($M_w$)≈350,000), anisole (ReagentPlus, ≥99%), chloroform (ReagentPlus, ≥99.8%), pentane (anhydrous, ≥99%), trichloro(octadecyl)silane (OTS, ≥90%), and trichloro(1H,1H,2H,2H-perfluorooctyl)silane (FOTS, ≥97%) was purchased from Sigma. Spherical monodisperse silica microspheres, with nominal diameters of 0.26, 1.70, and 7.75 μm (coefficient of variation <10%), were obtained from Cospheric LLC. Ultra-smooth, mirror-finished copper sheets (99%, 28 gauge), which had a plastic protective layer, were obtained from Fire Mountain Gems and Beads.

After cutting the copper sheets into 5×5 cm$^2$ sheets and in preparation for spin-coating the polymer thin films, first the protective plastic layers were removed. Then, each sheet was cleaned individually using a commercial metal cleaner (Autosol Metal Polish from Autosol LLC.). After further cleaning by ultrasonication in pure ethanol for 40 min, the cleaned copper sheets were rinsed with ethanol and, to prevent their oxidation in air, they were kept in ethanol prior to coating them with the polymers.

For fabrication of PDMS micropillars (2, 5, 20 and 50 μm in diameter with aspect ratios of ~2), the PDMS prepolymer (with base-to-catalyst weight ratio of 10:1) was poured over the photolithographic silicon master-molds, containing holes of specific geometrical properties. The thickness of the polymer backing layer was adjusted to ~1.5 mm by using a polytetrafluoroethylene (PTFE, Teflon) spacer. The cast polymer was degassed and then cured at 90° C. for 120 min Only the 2 μm PDMS pillars were cured at 135° C., in order to enhance their mechanical strength and lower the chance of their collapse and buckling during the cleaning process.

The polymer and the mold were cooled down to room temperature for several hours, and then the cured polymer was gently peeled off from the mold. To easily release the cured polymer from the mold, the mold was coated in advance with a self-assembled monolayer (SAM) of OTS. The mold for the fabrication of the 2 μm PDMS pillars was coated with a SAM of FOTS instead of OTS, considering that OTS coating was not very effective for removal of these small pillars from their mold. Flat PDMS reference samples were prepared with the same procedure as that used for the preparation of micropillars, but against a flat, OTS-coated silicon wafer.

In preparation for SAM-coating of the silicon molds and also flat silicon wafers with OTS, each silicon substrate was first cleaned by ultrasonication in pure chloroform at 40 kHz for 5 min, using Branson B5510 Ultrasonic Cleaner (Emerson Industrial Automation). Then, the substrate was immersed in a 0.8 mM solution of OTS in a mixture of pentane and chloroform (with 4:1 volumetric ratio). After 10 min, the sample was removed from the solution and subsequently ultrasonicated in pure chloroform for another 10 min, in order to remove the physically-adsorbed molecules from the surface. At the end, the sample was nitrogen dried and annealed under vacuum at 90° C. for 60 min.

SAM-coating of the silicon mold for fabrication of the 2 μm pillars as well as that of the PDMS samples with FOTS was carried out in the gas phase—under vacuum—at 110° C. for 60 min, in presence of 200 μL of FOTS and several milliliters of water. Prior to SAM-coating of the PDMS samples, they were plasma treated (using a PDC-32G plasma cleaner from Harrick Plasma) for 2 min, in order to activate the surface of the PDMS samples.

The PMMA thin films were spin-coated onto glass cover slips (2.2×2.2×0.1 cm$^3$, from VWR International LLC.), which were plasma treated beforehand for 1 min. PMMA solution (5 wt % PMMA in anisole) was spin-coated onto the cover slips at 1500 rpm for 30 s, using a WS-400-6NPP Spin Coater (Laurell Technologies Corporation). PMMA thin films for charge measurements—with a thickness of 4.2±0.1 μm (n=6)—were produced from a 15 wt % solution of PMMA in anisole, which was spin-coated onto 5×5 cm$^2$ copper sheets at 750 rpm for 30 s. After spin-coating, all PMMA thin films were dried at 60° C. for 60 min, under a flow of nitrogen. The complete drying was achieved by heating the thin films under a flow of nitrogen for another 60 min at 160° C., followed by 30 min annealing under vacuum at the same temperature.

PDMS thin films for charge measurements—with a thickness of 5.3±0.2 μm (n=6)—were produced by spin-coating the PDMS prepolymer (with base to catalyst weight ratio of 10:1) onto 5×5 cm$^2$ mirror-finished copper sheets. PDMS thin films were then cured at 90° C. for 120 min In order to prevent oxidation of the underlying copper sheets, curing was carried out under a flow of nitrogen. The thickness of the polymer thin films was measured by thin film step height measurement, using an Alpha-Step 200 Profilometer (KLA-Tencor Corporation). Roughness of the polymer thin films, flat PDMS substrates, and silica substrates were estimated by atomic force microscopy (AFM) from a 5×5 μm$^2$ area from the surface of the samples using a Dimension FastScan Atomic Force Microscope (Bruker Corporation). The tip used for AFM imaging was a SCANASYST-AIR, silicon nitride tip (with nominal tip radius of 2 nm), obtained from Bruker Corporation.

Polarity characteristics (i.e., hydrophobicity and hydrophilicity) of the PMMA thin films as well of those of the cleaning materials and silica substrates were determined by water contact angle measurement tests, consisting the measurement of the static contact angle of a (6-10 μL) water droplet by a NRL Contact Angle Goniometer (ramé-hart, inc.).

Contamination of PMMA thin films with silica particles was achieved by first soiling an aluminum foil with the silica particles of choice. After shaking the aluminum foil to attain almost a monolayer of particles on the foil, the PMMA thin film (which was electrostatically charged beforehand with a soft nylon brush (6150 FAN from Princeton Artist Brush Company)) was gently brought into contact with the particles on the aluminum foil, and then slowly removed. The static charges at the surface of the particles as well as those at the surface of the PMMA thin films were subsequently discharged using a Zerostat 3 Antistatic Gun (Armour Home Electronics Ltd.).

To clean silica particles from the contaminated PMMA thin films with either flat PDMS sheets or PDMS micropillars according to the systems/methods of the present disclosure, first a stripe of the cleaning material (6 cm in length and 2 cm in width) was folded onto its back to make a droplet shape. Then, the folded stripe was gently tapped fifty times on various spots on the surface of the contaminated thin film in order to remove the deposited silica particles from the surface. The cleaning quality was investigated by scanning electron microscope (SEM) imaging from the surface of both the substrate and the cleaning material, performed on an Ultra-High-Resolution Analytical FE-SEM (SU-70, Hitachi High-Technologies Corporation) operating at 2 kV. In preparation for SEM imaging, each sample was coated with a thin (~20 nm) chromium layer, which was sputtered on the sample by a Desk V sputtering instrument from Denton Vacuum, LLC.

For AFM adhesion force measurements, tipless silicon nitride cantilevers (NP-O from Bruker Corporation) were first cleaned in an UV/ozone cleaner (BioForce Nanosciences) for 20 min. Then, a 7.75 μm silica particle was glued to the tip of the "A" cantilever (nominal frequency=65 kHz; nominal spring constant=0.35 N/m), using UV-curable adhesive (Norland Optical Adhesive 68 from Norland Products Inc.), and cured for 20 min in the UV/ozone cleaner.

Adhesion forces between the samples and the silica-functionalized cantilevers were measured on a Dimension Icon AFM instrument (Bruker Corporation). Before adhesion test measurements, the possible static charges at the surface of the particle as well as those at the surface of the substrate were discharged using a Zerostat 3 Antistatic Gun (Armour Home Electronics Ltd.). The cantilever deflection sensitivity and spring constant were determined for each cantilever using the thermal noise method.[41]

Force measurements were collected using a trigger force of 100 nN, a ramp size of 5 μm, and a ramp rate of 0.5 Hz. Adhesion force traces (see FIGS. 1.A1, 1.A2, and S1) were determined by converting curves of cantilever deflection vs. piezoelectric stage retraction to force vs. displacement, using Nanoscope Analysis Version 1.5 (Bruker Corporation). The Young's modulus of the unstructured, flat PDMS samples (2.7±0.3 MPa (n=10)) and that of the flat FOTS-coated PDMS samples (0.3±0.1 MPa (n=10)) were estimated using Nanoscope Analysis Version 1.5, by fitting the Hertzian model[42] in the force vs. displacement indentation plots, considering the material Poisson's ratio of 0.5.[43]

In calculating the surface charge densities during contact, since both the silica and polymer surfaces were perfectly smooth, the actual separation distance (D) was considered as that of the interatomic separation distance of ~0.3 nm.[10] The charge penetration depths, $d_P$ and $d_{si}$, were considered equal and approximated by 3 nm.[46]

It should be noted that at the relative humidity (RH) of 10±1% where the experiments were carried out, it is expected that small amounts of water are adsorbed over the polymer thin films and silica discs.[11, 21] However, since at this low humidity level, the thickness of the adsorbed layer of water is typically less than 0.2 nm (roughly a thickness of a monolayer of water)[21] and seeing that the dielectric constant of a monolayer of water (≈6) is not very high (as that of the bulk of water (≈80)), the presence of water at the interface was ignored, given that the effect of its incorporation in charge measurements was negligible.[27] Before performing charge measurement tests, both the polymer thin films and silica substrates were discharged (using a Zerostat 3 Antistatic Gun (Armour Home Electronics Ltd.)) in order to remove any static charge which may have built up on them.

Similar to charge measurements, in calculations of contact electrification-driven adhesion forces (Equations 4 and 5), the dielectric constant of the separating medium ($\varepsilon_D$) was considered similar to the dielectric constant of air (which is equal to 1). However, if it is considered that a water monolayer is present at the contact interface, the dielectric constant of the separating medium ($\varepsilon_D$) would be a little larger and the calculated adhesion strength values, which were determined using Equation 4, would be slightly smaller. In particular, when having a monolayer of water at the contact interface, the effective dielectric constant ($\varepsilon_r$) for PDMS/silica and PMMA/silica would increase to only 3.2 (from 2.9) and 4.0 (from 3.4), respectively, leading to very negligible decline in the calculated adhesion strength values for both PDMS and PMMA.

2. Additional Calculations: Estimation of the Adhesive and Geometrical Properties of PDMS/Silica and PMMA/Silica Interfaces Using the JKR Model; Calculations of the Area of a Contaminated Surface that can be Cleaned Using a Unit Surface Area of a Polymeric Sheet Patterned with Pillars The magnitude of van der Waals (vdW) interaction force between silica particles and both polydimethylsiloxane (PDMS) and poly(methyl methacrylate) (PMMA) can be determined by using the well-known Johnson-Kendall-Roberts (JKR) model.[19, 20] According to this model,[20] the vdW adhesion force between two substrates in intimate contact can be simply estimated by $F_{vdW}=-1.5\pi R\gamma$, where γ is the interface energy or surface energy change per unit area for two perfectly smooth surfaces.[19] The magnitude of the interface energy, which is basically dictated by the vdW interactions, can be determined by $\gamma=\gamma_1+\gamma_2-\gamma_{12}$, where $\gamma_1$ and $\gamma_2$ are the surface energies of phase 1 (silica) and phase 2 (PDMS or PMMA), respectively, whereas $\gamma_{12}$ is the interfacial energy which can be approximated by $\gamma_{12}=(\gamma_1 \cdot \gamma_2)^{1/2}$.[19] By considering the surface energy of silica equal to 75.0 mJ/m², [21] while that of PDMS and PMMA equal to 19.8 and 41.1 mJ/m², [22, 23] respectively, then we have $F_{vdW,PDMS}=-1.0$ μN and $F_{vdW,PMMA}=-1.1$ μN.

According to the JKR theory,[20] the penetration depth (δ) of a particle (with a radius R) in a flat substrate under the applied load of $P_0$ can be obtained from $$\delta = \frac{r^2}{R} - \frac{2}{3}\sqrt{\frac{6\pi\gamma r}{K}} \qquad \text{Equation 6}$$

where r is the radius of the contact area and $K=4/(3\pi(k_{si}+k_P))$; $k_{si}$ and $k_P$ are the elastic constants of the silica particle and polymers, respectively. The elastic constants are defined as $$k_{Si} = \frac{1-v_{si}^2}{\pi E_{si}} \qquad \text{Equation 7}$$

and $$k_P = \frac{1-v_P^2}{\pi E_P} \qquad \text{Equation 8}$$

where $v_{si}$ and $v_P$ are the Poisson ratios of silica and polymers, respectively, and $E_{si}$ and $E_P$ are the corresponding values of Young's modulus. The JKR model defines the actual contact radius (r) as $$r^3 = \frac{R}{K}\left(P_0 + 3\gamma\pi R + \sqrt{6\gamma\pi R P_0 + (3\gamma\pi R)^2}\right) \qquad \text{Equation 9}$$

Using this model and considering the Young's modulus of PMMA, PDMS, and silica as typical values of 2.1 GPa,[24] 2.7 MPa, and 71.7 GPa,[25] respectively, while their Poisson ratios as 0.4,[26] 0.5,[27] and 0.16,[25] respectively, it can be determined that the penetration depth of a 7.75 µm silica particle in PDMS and PMMA are approximately 207 and 3 nm, respectively. According to the JKR model, the actual contact radius (r) for PDMS is ~1.5 µm, while that for PMMA is ~0.2 µm.

To determine the area of a contaminated surface (with a monolayer of 7.75 µm silica particles) that can be cleaned using a unit surface area of a PDMS sheet patterned with 50 µm pillars, an initial calculation is made to determine how much empty space exists between these pillars (which were organized in a hexagonal pattern with wall-to-wall separation distance of 50 µm). Based on this initial calculation, it was determined that in a 1 cm$^2$ of a patterned structure, there is 6.1×10$^{-3}$ cm$^3$ empty space between the pillars. Therefore, if 7.75 µm silica particles are closely packed in a hexagonal pattern (hexagonal close-packed (hcp)) with unit cell volume of ~2.0×10$^{-9}$ cm$^3$) within this space between the pillars, then geometrical analysis indicates that ~1.8×10$^7$ particles can be adsorbed by 1 cm$^2$ of 50 PDMS pillars.

In the next step, a calculation is made as to the number of particles that can arrange in a hexagonal pattern over a unit surface area of a flat PMMA substrate (to make a monolayer of silica particles). Doing so, it is determined that, with a monolayer of 7.75 µm silica particles (packed in a hexagonal pattern) over a PMMA thin film, 1.9×10$^6$ particles would exist over 1 cm$^2$ of the surface of the contaminated thin film. By dividing the number of 7.75 µm particles which can fit in the empty space between the 50 µm pillars, into the number of particles which exist in a monolayer of particles over a unit surface area of the PMMA thin film, it is determined that a 1 cm$^2$ sample of 50 µm PDMS pillars should be effective in cleaning over 9 cm$^2$ area of a substrate contaminated with a monolayer of 7.75 µm silica particles (1.8×10$^7$ 1.9×10$^6$ 9.5) according to the present disclosure.

3. Experimental Procedure—Second Experimental Regimen

What allows the disclosed µ-dusters to remove dust particles from the surface of a contaminated substrate is the strong adhesion of these materials with the contaminant particles. When the adhesion of µ-dusters with the dust particles is greater than that between the particles and the substrate, these cleaning materials are effective in easily and efficaciously removing the dust particles from the surface of the substrate upon the duster's retraction. Adhesion of dust particles to µ-dusters—and also to the substrate—depends on various factors, the most important of which are the mechanical and interfacial properties of the contacted materials.

Silica, poly(methyl methacrylate) (PMMA), Teflon AF, and polydimethylsiloxane (PDMS) were chosen as test substrates due to their distinct mechanical and interfacial properties (Table 1), allowing an effective study of the physical properties of materials that can be cleaned using µ-dusters according to the present disclosure.

TABLE 1

Young's modulus (E), Hamaker constant ($A_{132}$), effective Hamaker constant ($A_{eff}$), water contact angle (θ), surface charge density ($\sigma_s$), roughness average ($R_a$), root-mean-square roughness parameter ($R_{RMS}$), and maximum peak height ($R_P$) for PDMS, Teflon AF, PMMA, and silica.

| Substrate | PDMS | Teflon AF | PMMA | Silica |
| --- | --- | --- | --- | --- |
| E [GPa] | 2.7 × 10$^{-3}$ | 1.6 | 2.1 | 71.7 |

TABLE 1-continued

Young's modulus (E), Hamaker constant ($A_{132}$), effective Hamaker constant ($A_{eff}$), water contact angle (θ), surface charge density ($\sigma_s$), roughness average ($R_a$), root-mean-square roughness parameter ($R_{RMS}$), and maximum peak height ($R_P$) for PDMS, Teflon AF, PMMA, and silica.

| Substrate | PDMS | Teflon AF | PMMA | Silica |
| --- | --- | --- | --- | --- |
| $A_{132}$ [J × 10$^{-20}$] | 5.5 | 4.3 | 6.4 | 6.0 |
| $A_{eff}$ [J × 10$^{-20}$] | — | — | 2.9 | 2.7 |
| θ [degrees] | 108 ± 1 | 121 ± 1 | 82 ± 1 | 64 ± 1 |
| $\sigma_s$ [mC/m$^2$] | 1.5 ± 0.1 | 1.8 ± 0.1 | 0.5 ± 0.1 | — |
| $R_a$ [nm] | 1.5 ± 0.1 | 1.0 ± 0.1 | 0.8 ± 0.1 | 0.6 ± 0.1 |
| $R_{RMS}$ [nm] | 1.9 ± 0.2 | 1.2 ± 0.1 | 1.0 ± 0.1 | 0.8 ± 0.2 |
| $R_P$ [nm] | 30.4 ± 7.9 | 7.6 ± 1.0 | 5.9 ± 0.5 | 9.0 ± 2.4 |

PDMS micropillars (2 and 50 µm in diameter with aspect-ratios of ~2) were used as the µ-dusters, while unstructured flat PDMS sheets were employed as the control samples. Monodisperse silica particles (0.26 and 7.75 µm in diameter) were used as the model contaminant particles.

a. Fabrication

For fabrication of polydimethylsiloxane (PDMS) cleaning materials, the PDMS prepolymer (with base to catalyst weight ratio of 10:1) was poured over silicon master-molds. A flat silicon wafer was used for the fabrication of the unstructured, flat cleaning materials. Using a polytetrafluoroethylene (PTFE, Teflon) spacer, thickness of the polymer backing layer was adjusted to ~1.5 mm. After degassing the cast polymer, the polymer was cured at 90° C. for 120 min 2 µm pillars were cured at 135° C., instead of 90° C., in order to improve their mechanical properties and accordingly inhibit their collapse and buckling during cleaning. The polymer and the mold were subsequently cooled down to room temperature for several hours and then, the cured polymer was gently peeled off from the mold. To easily release the cured polymer from the mold, the silicon master-molds were coated in advance with a self-assembled monolayer (SAM) of trichloro(octadecyl)silane (OTS). The mold for the fabrication of the 2 µm pillars was coated with a SAM of trichloro(1H,1H,2H,2H-perfluorooctyl)silane (FOTS), instead of OTS. OTS and FOTS coating of the molds was carried out according to a previously reported procedure.[1] FOTS coating of the PDMS cleaning materials was carried out according to the same procedure used for FOTS coating of the silicon molds. However, only in preparation for SAM-coating of the PDMS samples and in order to activate the surface of these samples, they were O$_2$/plasma treated—at high power setting—for 2 min, using a PDC-32G plasma cleaner from Harrick Plasma.

In preparation for spin-coating of the polymer solutions (with the exception of poly(methyl methacrylate) (PMMA)) onto glass coverslips and prior to coating the substrates with the polymer thin films, each glass substrate was plasma treated at high power setting for 1 min using the PDC-32G plasma cleaner (from Harrick Plasma). PMMA thin films were coated on untreated glass substrates. The corresponding polymer precursor solution, concentration (C), spin speed (ω), and spin time (t) are detailed in Table 2. After spin-coating, PMMA and Teflon AF thin films were dried under a flow of nitrogen at 60° C. for 60 min. The complete drying of PMMA and Teflon AF thin films was achieved by heating the thin films under a flow of nitrogen for another 60 min at 160 and 180° C., respectively, followed by 30 min annealing under vacuum at the same temperatures. PDMS thin films were cured in a regular oven at 90° C. for 120 min

TABLE 2

The corresponding solvent, concentration (C), spin speed (ω), and spin time (t) for fabrication of each polymer thin film, as well as the ultimate thin film thickness ($h_t$) for each substrate.

| Substrate | Solvent | C [wt %] | ω/t [rpm/s] | $h_t$ [nm] |
|---|---|---|---|---|
| Teflon AF | FC-40 | 2 | 1300/30 | 260 ± 10 (n = 6) |
| PMMA | Anisole | 5 | 1500/30 | 260 ± 5 (n = 6) |
| PDMS | — | — | 7000/30 | 8.8 ± 0.1 (n = 6)[a] |

[a] The reported thickness value is in μm.

b. Characterization

The tips used for atomic force microscopy (AFM) roughness measurements were SCANASYST-AIR, silicon nitride tips from Bruker Corporation (nominal tip radius=2 nm; nominal spring constant=0.4 N/m). The roughness average ($R_a$), maximum peak height ($R_P$), and root mean square roughness parameter ($R_{RMS}$) for each sample was estimated by analyzing the obtained AFM images using Nanoscope Analysis Version 1.5 (Bruker Corporation). Before analysis, a third-order Flatten and Plane fit function was applied to each image. Next, the built-in Roughness, Power Spectral Density (PSD), and Peak commands were used to obtain $R_a$, $R_P$, and $R_{RMS}$ values, respectively.

For AFM adhesion force measurements, a 7.75 μm silica particle was glued to a tipless silicon nitride cantilever (the "A" cantilever of NP-O probe from Bruker Corporation (nominal frequency=65 kHz; nominal spring constant=0.35 N/m)). Before mounting the silica particle on the AFM cantilever, the cantilever was cleaned in an ultraviolet (UV)/ozone cleaner (from BioForce Nanosciences) for 20 min Next, the particle was glued to the cantilever using a UV-curable adhesive (Norland Optical Adhesive 68 from Norland Products Inc.), which was cured for 20 min in the same UV/ozone cleaner. Before all adhesion tests, the possible static charges at the surface of the particles as well as those at the surface of the substrates were discharged using a Zerostat 3 Antistatic Gun (Armour Home Electronics Ltd.). Adhesion force measurements were carried out using a preload of 100 nN, a ramp size of 5 μm, and a ramp rate of 0.5 Hz. Using Nanoscope Analysis Version 1.5 (Bruker Corporation), the obtained curves of cantilever deflection vs. piezoelectric stage retraction were converted to force vs. displacement plots.

For contaminating the substrates with silica particles, first an aluminum foil was soiled with the silica particles of the choice. Next, the aluminum foil was gently shaken to obtain an almost a monolayer of particles on the foil. Then, the substrate (which was electrostatically charged beforehand with a soft nylon brush (6150 FAN from Princeton Artist Brush Company)) was gently brought into contact with the particles on the aluminum foil and then slowly removed. After removing the substrate from the aluminum foil, the static charges at the surface of the particles and those at the surface of the substrate were discharged using a Zerostat 3 Antistatic Gun (Armour Home Electronics Ltd.).

In order to remove the deposited silica particles from the surface of a contaminated substrate, first a stripe of the cleaning material (~6 cm in length and 2 cm in width) was folded onto its back to make a droplet shape. Then, the folded stripe was gently tapped fifty times on various spots on the surface of the contaminated substrate. All cleanings in this study were carried out within 1-2 min after the contamination of the substrates with silica particles, while all experiments were independently replicated at least three times.

In preparation for SEM imaging, an approximately 20 nm chromium, iridium, or gold layer was sputtered on each sample. A Desk V sputtering instrument (from Denton Vacuum, LLC), a 208HR High Resolution Sputter Coater (from Cressington Scientific Instruments Ltd.), and a 108 Sputter Coater (from Cressington Scientific Instruments Ltd.) were used for sputtering chromium, iridium, and gold, respectively.

For charge measurements, Teflon AF thin films (with the thickness of 5.2±0.1 (n=6)) were produced from a 5 wt % solution of Teflon AF in FC-40. The polymer solution was spin-coated onto 5×5 $cm^2$ copper sheets at 750 rpm for 30 s. Teflon AF thin films were then dried under a flow of nitrogen at 60° C. for 60 min, followed by further drying under a flow of nitrogen for another 60 min at 180° C. Complete drying was achieved by subsequent annealing of the thin films under vacuum at 180° C. for 30 min Charge measurements for Teflon AF thin films were carried out by gently placing an optical-grade, polished silica disc (25.4 mm in diameter, 3.2 mm in thickness, from Ted Pella, Inc.) on the samples. Prior to performing charge measurements, silica discs were cleaned for 2 min using a PDC-32G plasma cleaner (from Harrick Plasma), which was set at high power setting. In preparation for charge measurements, possible charges on the surface of both the substrates and silica discs were discharged using a Zerostat 3 Antistatic Gun (Armour Home Electronics Ltd.). Charge measurements were carried out in a glove-bag (purchased from Sigma), where the humidity was set to ~10% by purging the chamber with nitrogen. The density of electric charges formed during contact of the silica discs with the substrates were recorded using a 6517B Electrometer/High Resistance Meter (Keithley Instruments), which was connected to the conductive material under the substrates.

Knowing the amount of the induced charges in the conductive backing layer ($\sigma_{image}$) and neglecting the effect of charge backflow via tunneling, the actual surface charge density upon contact ($\sigma_s$) was determined by[2]

$$\sigma_s = \frac{\sigma_{image}}{\left(\frac{(h_P - d_P)}{\varepsilon_P} - \frac{d_{si}}{\varepsilon_{si}} + \frac{D}{\varepsilon_D}\right)}(D + d_P + d_{si})$$ (S1)

where D is the actual separation distance between the silica disc and the thin film, while $d_P$ and $d_{si}$ are the charge penetration depths in the polymer and silica, respectively. In Equation S1, $h_P$ is the thickness of the polymer thin film, while $\varepsilon_P$, $\varepsilon_{si}$, and $\varepsilon_D$ are the dielectric constants of the polymer, the silica disc, and the separating medium, respectively. Since both silica discs and substrates were perfectly smooth, the actual separation distance (D) was considered equal to the interatomic separation distance of ~0.3 nm.[3] The charge penetration depths ($d_P$ and $d_{si}$) were considered equal and approximated by 3 nm.[4] In estimation of the surface charge densities using Equation S1 (and also in calculations of contact electrification-driven adhesion forces in the following section), the dielectric constant of the separating medium ($\varepsilon_D$) was considered equal to 1, the dielectric constant of air. However, it is expected that even at the relative humidity (RH) of 10±1%, where the experiments were carried out, small amounts of water get adsorbed over the surface of the silica discs.[5] If it is considered that a water monolayer is present at the contact interface, the dielectric constant of the separating medium ($\varepsilon_D$) would be different from the assumed value of 1 for air. Even so, the presence of water at the interface was neglected, considering that the effect of its incorporation in charge and electrostatic force measurements was negligible.[1, 6]

c. Calculations

According to the Hamaker model,[3] the van der Waals (vdW)-driven adhesion force ($F_{vdW}$) that a silica microparticle (phase 1) can generate upon contact with a substrate (phase 2) across air (medium 3) at the separation distance D can be determined from $$F_{vdW} = -\frac{A_{132}R}{6D^2} \quad (S2)$$

where $A_{132}$ is the Hamaker constant between phase 1 and phase 2, interacting across medium 3, while R is the radius of the silica microparticle. Using Equation S2 and assuming that all substrates of this study could come into intimate molecular separation distance with silica particles (i.e., D≈0.3 nm), while having their corresponding Hamaker constants ($A_{132}$) from the Lifshitz model (Equation S3),[3] the vdW-driven adhesion forces that these substrates can develop upon contact with silica particles were estimated.

The Hamaker constant ($A_{132}$) for contact of each material of this study with silica particles has been determined according to the Lifshitz model, as[3]

$$A_{132} \approx \frac{3}{4}kT\left(\frac{\varepsilon_1 - \varepsilon_3}{\varepsilon_1 + \varepsilon_3}\right)\left(\frac{\varepsilon_2 - \varepsilon_3}{\varepsilon_2 + \varepsilon_3}\right) + \frac{3h\nu_e}{8\sqrt{2}} \frac{(n_1^2 - n_3^2)(n_2^2 - n_3^2)}{(n_1^2 + n_3^2)^{\frac{1}{2}}(n_2^2 + n_3^2)^{\frac{1}{2}}\left\{(n_1^2 + n_3^2)^{\frac{1}{2}} + (n_2^2 + n_3^2)^{\frac{1}{2}}\right\}} \quad (S3)$$

where k is Boltzmann's constant, T is the temperature, h is Planck's constant, and $\nu_e$ is the electron absorption frequency (typically around $3\times10^{15}$ 1/s). $\varepsilon_1$, $\varepsilon_2$, and $\varepsilon_3$ are the dielectric constants of phase 1, phase 2, and medium 3, respectively, while $n_1$, $n_2$, and $n_3$ are the corresponding refractive indices of phase 1, phase 2, and medium 3, respectively.[3]

According to the modified Rumpf model,[7] the vdW interaction force between an atomically smooth spherical silica particle of radius R (phase 1) and a substrate with the root mean square roughness parameter $R_{RMS}$ (phase 2) across air (medium 3) can be determined from $$F_{vdW} = -\frac{A_{132}R}{6H_0^2}\left[\frac{1}{1 + \frac{R}{1.48R_{RMS}}} + \frac{1}{\left(1 + \frac{1.48R_{RMS}}{H_0}\right)^2}\right] \quad (S4)$$

where $H_0$ is the distance of the closest approach between the two surfaces, which can be approximated by the typical intermolecular separation distance of ~0.3 nm.[3]

To quantify the changes in the vdW-driven adhesion forces that form between the hydrophilic substrates (i.e., silica and PMMA) and silica particles, when water is present at their contact interfaces, the Hamaker method (Equation S2) can be employed again; but it has to be used in the form of $$F_{vdW} = -\frac{A_{eff}R}{6D^2} \quad (S5)$$

where $A_{eff}$ is the effective Hamaker constant of the system in presence of a monolayer of water at the contact interface. $A_{eff}$ can be estimated using[5]

$$A_{eff} = fA_{dry} + \rho f'A_{wet} \quad (S6)$$

where f is the areal fraction of the substrate surface which is in direct contact with the particle, whereas f' is the areal fraction of the substrate surface which is in contact with the particle surface through a monolayer of water. $A_{wet}$ and $A_{dry}$ are the Hamaker constants in wet and dry conditions, respectively, while ρ is the relative water coverage of the surface (≈0.12 at RH=10±1% (T=20±1° C.)).[1] Using f'=1.2f for an intimate contact,[5] and with the $A_{dry}$ and $A_{wet}$ values determined for PMMA and silica using the Lifshitz model (Equation S3), the effective Hamaker constants ($A_{eff}$) for PMMA and silica would be equal to $2.9\times10^{-20}$ and $2.7\times10^{-20}$ J, respectively. In calculation of the $A_{wet}$ values for PMMA and silica using Equation S3, the dielectric constant and refractive index of the separating medium were considered equal to 80 and 1.33, the typical values for the dielectric constant and refractive index of water.

According to the Johnson-Kendall-Roberts (JKR) theory,[8] the penetration depth (δ) of a particle (with a radius R≈3.9 μm) into the surface of a smooth substrate under the applied load $P_0$ can be obtained from $$\delta = \frac{r^2}{R} - \frac{2}{3}\sqrt{\frac{6\pi\gamma r}{K}} \quad (S7)$$

where r is the radius of the contact area. The magnitude of the interface energy (γ) can approximated by $\gamma = \gamma_{Pa} + \gamma_{Sub} - \gamma_{Pa.Sub}$, where $\gamma_{Pa}$ and $\gamma_{Sub}$ are the surface energies of the particle and substrate, respectively, whereas $\gamma_{Pa.Sub}$ can be approximated by $\gamma_{Pa.Sub} = (\gamma_{Pa} \cdot \gamma_{Sub})^{1/2}$.[3] Surface energies of silica, PMMA, Teflon AF, and PDMS were considered as 75.0,[9] 41.1,[19] 15.7,[11] and 19.8 mJ/m$^2$,[12] respectively. K=4/($3\pi(k_{Pa}+k_{Sub})$), while $k_{Pa}$ and $k_{Sub}$ are the elastic constants of the silica particle and substrate, respectively. These elastic constants are defined as $$k_{Pa} = \frac{1 - v_{Pa}^2}{\pi E_{Pa}} \quad (S8)$$

and $$k_{Sub} = \frac{1 - v_{Sub}^2}{\pi E_{Sub}} \quad (S9)$$

where $v_{Pa}$ and $v_{sub}$ are the Poisson ratios of the particle and substrate, respectively; $E_{Pa}$ and $E_{sub}$ are the corresponding values of the Young's modulus for the particle and substrate, respectively. The JKR model defines the actual contact radius (r) as[8]

$$r^3 = \frac{R}{K}\left(P_0 + 3\gamma\pi R + \sqrt{6\gamma\pi RP_0 + (3\gamma\pi R)^2}\right) \quad (S10)$$

Using the JKR model and considering the Poisson ratio of PDMS, Teflon AF, PMMA, and silica as 0.5,[13] 0.4,[11] 0.4,[14] and 0.16,[15] respectively, the penetration depth of a 7.75 μm silica particle in PDMS, Teflon AF, PMMA, and silica—under 100 nN applied load—would be approximately 207, 3, 3, and 0.5 nm, respectively. According to the JKR model, the actual contact radius (r) for PDMS, Teflon AF, and PMMA is equal to ~1.5, 0.2, 0.2 μm, while that for silica is only about 76.5 nm.

Using a simplifying assumption and considering the contact interface between the particles and the substrates as that between two charged flat parallel sheets, the magnitude of the electrostatic forces ($F_{elc}$) that with the surface charge density of $\sigma_s$ can be produced between the substrates and the particles can be determined using[6, 16]

$$F_{elc} = -\frac{a\sigma_s^2}{2\varepsilon_0 \varepsilon_r} \tag{S11}$$

where a is the area of charging, $\varepsilon_0$ is the permittivity of free space, and $\varepsilon_r$ is the effective dielectric constant of the contact interface, which can be obtained from[6]

$$\varepsilon_r = (D + d_{Sub} + d_{Pa}) \bigg/ \left( \frac{D}{\varepsilon_D} + \frac{d_{Sub}}{\varepsilon_{Sub}} + \frac{d_{Pa}}{\varepsilon_{Pa}} \right) \tag{S12}$$

In all calculations in this study, the dielectric constants of PDMS, Teflon AF, PMMA, and silica were considered as 2.7,[17] 1.9,[11] 4.0,[18] and 3.8,[3] respectively, while their refractive indices were considered as 1.41,[17] 1.31,[11] 1.49,[18] and 1.45.[3]

d. Discussion of Results

The four tested substrates, silica, PMMA, Teflon AF, and PDMS, have distinct interfacial properties; they have different affinities in generating van der Waals (vdW), capillary, and electrostatic forces, the three physical interfacial forces that can affect the interfacial behavior of these materials. In principle, vdW interactions always develop at the contact interface of these substrates with other objects (including dust particles).[15] Capillary interactions can also become effective when these substrates are in humid conditions, where sufficient amounts of water can condense at their surfaces.[15] Electrostatic interactions, on the other hand, naturally form—via the contact electrification (CE) phenomenon—at the surface of these substrates once they are brought into contact with other surfaces.[16-19] The affinity of the selected substrate materials in forming each of the noted interfacial forces (i.e., vdW, capillary, and electrostatic forces) upon contact with silica microparticles, and also the effect of the mechanical properties of these substrates and their role in their physical interfacial forces, are addressed herein.

e. Van der Waals Forces

The propensity of silica, PMMA, Teflon AF, and PDMS in forming vdW interactions with silica contaminant particles is theoretically quantified using the Hamaker model.[15] Interestingly, analysis of vdW forces with the Hamaker method indicates that silica, PMMA, Teflon AF, and PDMS should develop very close vdW adhesion forces ($F_{vdW}$=428, 460, 306, and 394 nN, respectively) upon contact with silica particles. Of note, these estimated values are for contact of the substrates with 7.75 μm silica particles, which have been used as the reference particles for all calculations and analyses herein.

In theory, the Hamaker method calculates that the selected substrate materials have—more or less—similar intrinsic affinities in generating vdW adhesion forces with silica particles, even though they have very distinct physical and chemical properties. However, it should be noted that the vdW adhesion forces that were calculated using the Hamaker method indicate only the maximum vdW adhesion forces that can be produced—upon intimate contact—between the substrates and the particles. In other words, all of the selected substrate materials have some level of surface roughness, which consequently can hinder the formation of close contact between these substrates and silica particles.[20, 21] Even though the surface roughness of the substrates are in nanometric and sub-nanometric ranges (Table 2), the nanoasperities at the surface of these substrates can still cause significant decline in the magnitude of the vdW interaction force that these substrates can develop with the contaminant particles.[20, 21]

The effect of the surface nanoasperities of the substrates on their vdW interactions with silica particles is theoretically evaluated using the modified Rumpf model.[21] According to this model, and further assuming that the nanoasperities at the surface of all the substrate materials are not deformable, it was found that the amount of the vdW adhesion force ($F_{vdW}$) that can be generated between the model 7.75 μm silica particles and silica, PMMA, Teflon AF, and PDMS substrates are equal to 18, 13, 6, and 4 nN, respectively. Thus, there are large differences between these vdW adhesion forces and those that were calculated using the Hamaker method, which basically signifies the crucial effect of the surface nanoasperities of the substrates on their vdW interactions.

Even so, it should be noted that in calculation of vdW forces with the modified Rumpf model, a simplifying assumption was made. In particular, it was assumed that the nanoasperities at the surface of the substrates do not deform upon contact with silica particles, which is a gross oversimplification. In reality, it is expected that the nanoasperities at the surface of the substrates deform up to a certain limit, depending on the rigidity of the substrates. Deformation of the surface nanofeatures makes possible the formation of closer contact between the particles and the substrates, leading to formation of vdW adhesion forces larger than those predicted by the modified Rumpf model, and thus closer to the maximum values estimated by the Hamaker method.

To elucidate on the effect of the deformation of the surface nanofeatures of the selected substrates on their vdW interactions with silica particles, the penetration depth (δ) of silica particles into the surface of all substrates under an identical external load were calculated using the Johnson-Kendall-Roberts (JKR) model.[22] According to the JKR model, the penetration depth of a 7.75 μm silica particle into the surface of silica, PMMA, Teflon AF, and PDMS—under a typical applied load of 100 nN—is equal to ~0.5, 3, 3, and 207 nm, respectively. Surface nanoasperities with the height equal or smaller than these estimated δ values are expected to be squeezed out upon contact with silica particles.[23] So, by comparing the δ values with the maximum peak height ($R_P$) value for each substrate (9.0±2.4, 5.9±0.5, 7.6±1.0, and 30.4±7.9 nm (n=5) for silica, PMMA, Teflon AF, and PDMS, respectively), it is clear that the softer the substrate, the better intimate contact, and so more effective vdW forces, it develops. For example, the nanoasperities at the surface of the softest substrate selected herein, PDMS (with Young's modulus of ~2.7 MPa and $R_P$ of 30.4±7.9 nm (n=5)), are expected to be completely squeezed out upon contact with a 7.75 μm silica particle, seeing that this size particle can penetrate about 207 nm into the surface of the PDMS substrates. In contrast to PDMS, however, the most rigid substrate selected herein, silica (with Young's modulus of ~71.7 GPa),[24] cannot develop an intimate molecular contact with a 7.75 μm silica particle, at least not throughout its entire contact zone with the particle. In the case of this substrate, the height of the surface nanofeatures ($R_P$=9.0±2.4 nm (n=5)) are much larger than the depth that a 7.75 μm silica microparticle can penetrate (~0.5 nm), which accordingly indicates that formation of intimate molecular contact—throughout the entire contact zone—for this substrate is not very practical.

f. Capillary Forces and Water Adsorption

Capillary forces are the other physical interfacial forces that—along with vdW and electrostatic forces—can affect the interfacial interactions of the substrate materials. Even so, the contribution of capillary forces in interfacial interactions of all substrates has been neglected, considering that the formation of capillary forces under the experimental conditions is doubtful.[25] Specifically, all experiments were carried out at the relative humidity (RH) of 10±1% (T=20±1°). At this low humidity level, water adsorption at the surface of the hydrophobic substrates (i.e., PDMS and Teflon AF with water contact angles (θ) of 108±1 and 121±1° (n=8), respectively) is practically negligible.[25] On the other hand, the Langmuir adsorption isotherm indicates that only about 12% of the surface of the hydrophilic substrates (i.e., PMMA and silica with water contact angles (θ) of 82±1 and 64±1° (n=8), respectively) will be covered with a monolayer of water at this humidity level. Considering that adsorption of this amount of water at the surface is still not sufficient to form capillary bridges, and so capillary interactions, the contribution of capillary forces in interfacial interactions of the hydrophilic substrates has also been neglected.

Although water adsorption at the low RH of 10±1% might not be enough to lead to formation of capillary forces, it should be considered that adsorption of even small amounts of water at the surface of any of these substrates can lead to significant change to the vdW interaction forces that they can develop with silica particles. Effect of water adsorption on vdW interactions is not very important for the hydrophobic substrates (i.e., PDMS and Teflon AF), given that water adsorption over the surface of these materials is practically negligible, particularly at this low humidity level.[25] However, the hydrophilic substrates (i.e., PMMA and silica) are expected to adsorb certain amounts of water over their surfaces at this humidity level, causing change to the vdW adhesion forces that these materials can develop upon contact with silica particles. In particular, with relative water coverage of ~0.12 at RH=10±1%, the vdW adhesion forces that PMMA and silica can develop upon contact with silica particles would be equal to 211 and 196 nN, respectively. In fact, these adhesion forces are less than half of the adhesion forces that these substrates can form in dry conditions. This is noteworthy when considering that the Hamaker model indicated that all selected substrate materials have—more or less—similar intrinsic affinities in generating vdW adhesion forces with silica particles. However, when the role of surface water adsorption is considered, it is clear that the hydrophilic substrates (PMMA and silica) are expected to generate smaller vdW forces in comparison to the hydrophobic substrates (PDMS and Teflon AF).

g. Contact Electrification and Electrostatic Forces

Other than vdW and capillary forces, electrostatic forces can also affect the interfacial properties of the selected substrate materials. More specifically, when these substrates are brought into contact with the contaminant particles, regardless of the type of the substrate, certain amounts of electric charges are expected to transfer between the contacted materials.[16,17,26] Transfer of electric charges at the contact interface leads to subsequent formation of electrostatic forces between the substrates and the contaminant particles.[18, 19, 27-29]

Unlike vdW and capillary forces, however, the propensity of the selected substrates in forming CE-driven electrostatic interactions with silica particles cannot be theoretically predicted.[17, 19] Therefore, surface charging of all substrates (with the exception of silica) was experimentally evaluated. In the case of silica substrates, however, the contribution of electrostatic forces was neglected, considering that charging for contact between two pure silica surfaces can be practically disregarded.[30-32] All other reported surface charge densities are for contact of the substrates with a 25.4 mm diameter polished silica disc ($R_{a,silica}$=1.0±0.1 nm (n=5)). Charge measurements were carried out by silica discs, instead of silica microparticles, considering that the measurement of CE-generated surface charges upon contact with silica microparticles was technically challenging, due to the small area of contact.

Surface charge densities ($\sigma_s$) formed upon contact of PMMA, Teflon AF, and PDMS with silica are equal to 0.5±0.1, 1.8±0.1, and 1.5±0.1 mC/m² (n=10), respectively. So, according to Equation 4, the electrostatic adhesion strength (i.e., adhesion force per unit surface area) that PMMA, Teflon AF, and PDMS can develop upon contact with a silica surface would be equal to 0.5±0.1, 7.8±1.4, and 4.4±0.8 N/cm², respectively. Hence, using the contact area value for each substrate, the CE-generated electrostatic forces that PMMA, Teflon AF, and PDMS can form upon contact with—model 7.75 μm—silica particles would be equal to ~0.6, 9.8, and 311.0 nN, respectively.

From the above estimations, it is clear that the most conformable material of those selected is PDMS, which can develop the closest proximity contact with silica particles, also develops stronger CE-generated electrostatic forces in comparison to other substrates, including Teflon AF and PMMA. Amongst the other substrates, however, Teflon AF can generate the largest electrostatic forces, while the effect of surface charging on silica/silica contact is completely neglected.

The above-estimated electrostatic adhesion forces can discriminate the intrinsic propensity of each selected substrate material in developing CE-driven electrostatic forces upon contact with silica dust particles. However, it should be noted that these estimated electrostatic force values do not reflect the actual values of the electrostatic forces that these materials can develop upon contact with silica particles. In other words, estimation of electrostatic forces—using Equation 4—has been carried out based on a simplifying assumption that considers that the area over which charging has happened is equal to the area of contact. This assumption can be reasonably correct for macrocontacts (i.e., contact between large objects), whereas for micro/nanocontacts (where contact takes place between micro/nanoarchitectured surfaces), this assumption is not necessarily accurate.[16, 33-35] This is because upon contact between two solid substrates, electric charges not only develop at the contact zone between the substrates, but also they develop outside and around the periphery of the contact area. Charging outside the contact zone is practically negligible for macrocontacts, and so the area of charging can be considered similar to the area of contact for these materials. For micro/nanocontacts, however, charging outside the contact zone can be decisive for the electrostatic interactions, given that the area over which charging happens for micro/nanomaterials can be significantly larger than the contact area for these materials.[16, 33-35]

Determining the exact area of charging, and so the actual values of the electrostatic forces, for contacts with silica microparticles is experimentally not practical, if not impossible. Even so, an upper limit for electrostatic adhesion forces of the selected substrate materials with silica microparticles can be foreseen. In particular, if it is assumed that the radius of the charged area is equal to the radius of the contacted particles (3.9 µm for the case of model 7.75 µm silica particles), which is a reasonable assumption for micro/nanocontacts,[34, 35] then the maximum value of the CE-driven electrostatic forces that the selected substrates can develop upon contact with silica particles can be approximated. Doing so, it was determined that the maximum electrostatic force that PMMA can develop upon contact with 7.75 µm silica particles is equal to 238.9, while that for PDMS and Teflon AF is about 2.1 and 3.7 µN, respectively.

Calculations of maximum electrostatic force values (when a similar area is considered for all substrates) indicate that the more effectively the material is charged, the larger electrostatic adhesion forces it exhibits. More importantly, these calculations also specify, albeit indirectly, that if surface charging occurs efficiently over the surface of these substrate materials, as is possible in the case of PDMS and Teflon AF, the electrostatic forces that develop upon contact with silica microparticles can be very large; indeed, large enough to be within the range of the cohesive forces of these type of materials.[27, 30, 31] In other words, electrostatic forces that the selected substrate materials (particularly PDMS and Teflon AF) generate can be large enough to overcome the cohesive forces of these substrates, even leading to rupture of these materials when their contact interfaces are debonded.

h. Total Adhesion

Figure 9:
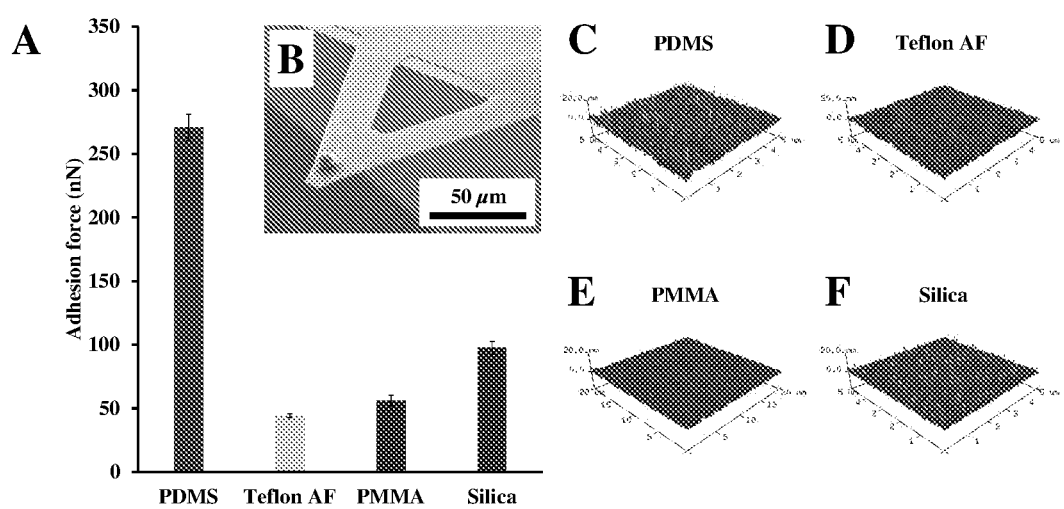
FIG. 9: (A) Adhesion of PDMS, Teflon AF, PMMA, and silica measured upon contact with (B) a 7.75 µm silica particle attached to a tipless atomic force microscope cantilever. Characteristic atomic force microscope images from 5×5 µm² area from the surface of (C) PDMS, (D) Teflon AF, (E) PMMA, and (F) silica.

Following the analysis of the surface interactions of the substrate materials and in order to fully understand the interfacial interactions of these materials with silica particles, actual values of the adhesion forces (i.e., pull-off forces) that can form between silica particles and the substrates are analyzed (see FIG. 9.A). These adhesion force results are measured with an atomic force microscope, and they are for contact of the substrates with model 7.75 µm silica particles (FIG. 9.B) under a typical preload of 100 nN, the same experimental conditions for which all other surface force analyses have been carried out herein.

PDMS—Hydrophobic, Soft, and Low-Surface-Energy:

As depicted in FIG. 9.A, upon contact with 7.75 µm silica particles, PDMS develops significantly large adhesion force of 270.6±10.3 nN (n=10), whereas, Teflon AF, PMMA, and silica generate relatively smaller adhesion forces of 44.2±1.4, 56.0±4.2, and 97.6±5.1 nN (n=10), respectively. PDMS generates significantly larger adhesion forces in comparison to other substrates. On the one hand, the relatively soft surface of this polymer makes possible the formation of strong vdW forces by this polymer, in part helping the formation of strong adhesion forces between PDMS and silica particles. On the other hand, the tendency of PDMS in forming close contact with silica particles also leads to effective surface charging and, therefore, relatively strong electrostatic interactions between the particles and PDMS. Of equal importance, water adsorption over the surface of this hydrophobic polymer is also very minimal, which in turn diminishes the weakening effect that water adsorption can have on vdW adhesion forces of this substrate upon contact with silica particles.

Teflon AF—Hydrophobic, Semi-Rigid, and Low-Surface-Energy:

Unlike PDMS, however, the smoother yet more rigid surface of Teflon AF fails to develop strong adhesion forces with silica particles (FIGS. 9.A, C, and D). Theoretically, Teflon AF and PDMS have similar intrinsic propensities in forming vdW forces with silica particles. However, because of its more rigid structure and unlike PDMS, Teflon AF (with Young's modulus of 1.6 GPa)[36] fails to develop intimate molecular contact—and so effective vdW interactions—with the contaminant particles. Furthermore, the rigidity of Teflon AF also apparently limits the effectiveness of surface charging at the surface of this polymer, leading to smaller electrostatic adhesion forces of this polymer in comparison to PDMS. Consequently, the actual adhesion of Teflon AF upon contact with a 7.75 µm silica particle (44.2±1.4 nN (n=10)) is relatively very small, only about 16% of that of PDMS (270.6±10.3 nN (n=10) at the same contact.

PMMA—Hydrophilic, Semi-Rigid, and Low-Surface-Energy:

When contacted with silica particles, the adhesion that Teflon AF generates (44.2±1.4 nN (n=10)) is very close to that of PMMA (56.0±4.2 nN (n=10)). PMMA (with a Young's modulus of 2.1 GPa)[37] is almost as rigid as Teflon AF, while these two semi-rigid polymers also have very similar surface roughness parameters (see Table 2 and FIGS. 9.D and E). More importantly, the intrinsic tendencies of both of these polymers to form vdW forces are very much alike. Even so, due to the affinity of PMMA to adsorb water on its hydrophilic surface ($\theta_{PMMA}=82\pm1°$ (n=8)), it is expected that PMMA generates smaller vdW adhesion forces in comparison to Teflon AF ($\theta_{Teflon\ AF}=121\pm1°$ (n=8)). In addition to vdW interaction forces, the electrostatic adhesion forces generated by PMMA are also smaller than those of Teflon AF. As PMMA is expected to develop smaller vdW and electrostatic forces in comparison to Teflon AF, the closeness between the actual measured adhesions of these two polymers must be due to another force. In fact, in addition to vdW and electrostatic interactions, PMMA surface can also develop hydrogen bonds with silica substrates (something that Teflon AF cannot do),[38,39] which consequently can increase the interfacial forces between this polymer and silica particles. A discussion of the possible effect of hydrogen bonding on adhesion of the selected substrates (including PMMA) is provided in the following subsection.

Silica—Hydrophilic, Rigid, and Very High-Surface-Energy:

The intrinsic affinity of PMMA in the formation of vdW interactions is comparable to that of silica, the other selected hydrophilic substrate. However, since silica (with a Young's modulus of 71.7 GPa) is significantly more rigid and slightly rougher than PMMA (see Table 2 and FIGS. 9.E and F), it is expected that it develops smaller vdW forces in comparison to PMMA. Besides, electrostatic interactions are considered to have no impact on interfacial interactions of silica, an assumption that could not be made for PMMA. Nevertheless, the actual adhesion of silica is significantly larger than that of PMMA (FIG. 9.A). One credible reason for this discrepancy in adhesion results could be the presence of hydroxyl groups at the surface of silica substrates. Specifically, the surfaces of silica materials natively host a large number of hydroxyl groups (up to ~5 hydroxyl groups per 1 $nm^2$).[40] Hydroxyl groups naturally promote the formation of hydrogen bonds (and even covalent bonds)[15] between two silica surfaces, theoretically leading to significantly large adhesion forces between silica substrates and silica particles. As pointed out earlier, hydroxyl groups can also enhance the interfacial interaction forces of silica particles with other selected substrates, particularly PMMA, which also have the necessary functional groups to form hydrogen—and covalent—bonds with the surface of the silica particles.

Of note, the presence of hydroxyl groups at the surface of silica can also promote the surface charging between the silica particles and silica substrates. In other words, the preceding assumption, which indicated that surface charging at silica/silica contacts is negligible, is only valid for contacts between two pure silica surfaces.[30, 31] If the chemical composition of the surface of one of the two contacted silica surfaces is different (even slightly) from the other one, it is expected that effective CE, and so electrostatic interactions, develop at the contact between the two silica surfaces.[26] For instance, by chemisorption of a monolayer of an aminosilane at the surface of silica, formation of surface charge densities as large as 3 mC/m$^2$ for silica/silica contacts have been reported.[30] Considering this, the relatively large adhesion between silica substrates and silica particles can be partly attributed to the possible difference in the chemical composition (i.e., number of hydroxyl groups per unit surface area) of the surface of these two, leading to possible formation of electrostatic interactions between the substrates and the particles.[26]

i. Particulate Contamination Cleaning i. PDMS

Figure 10:
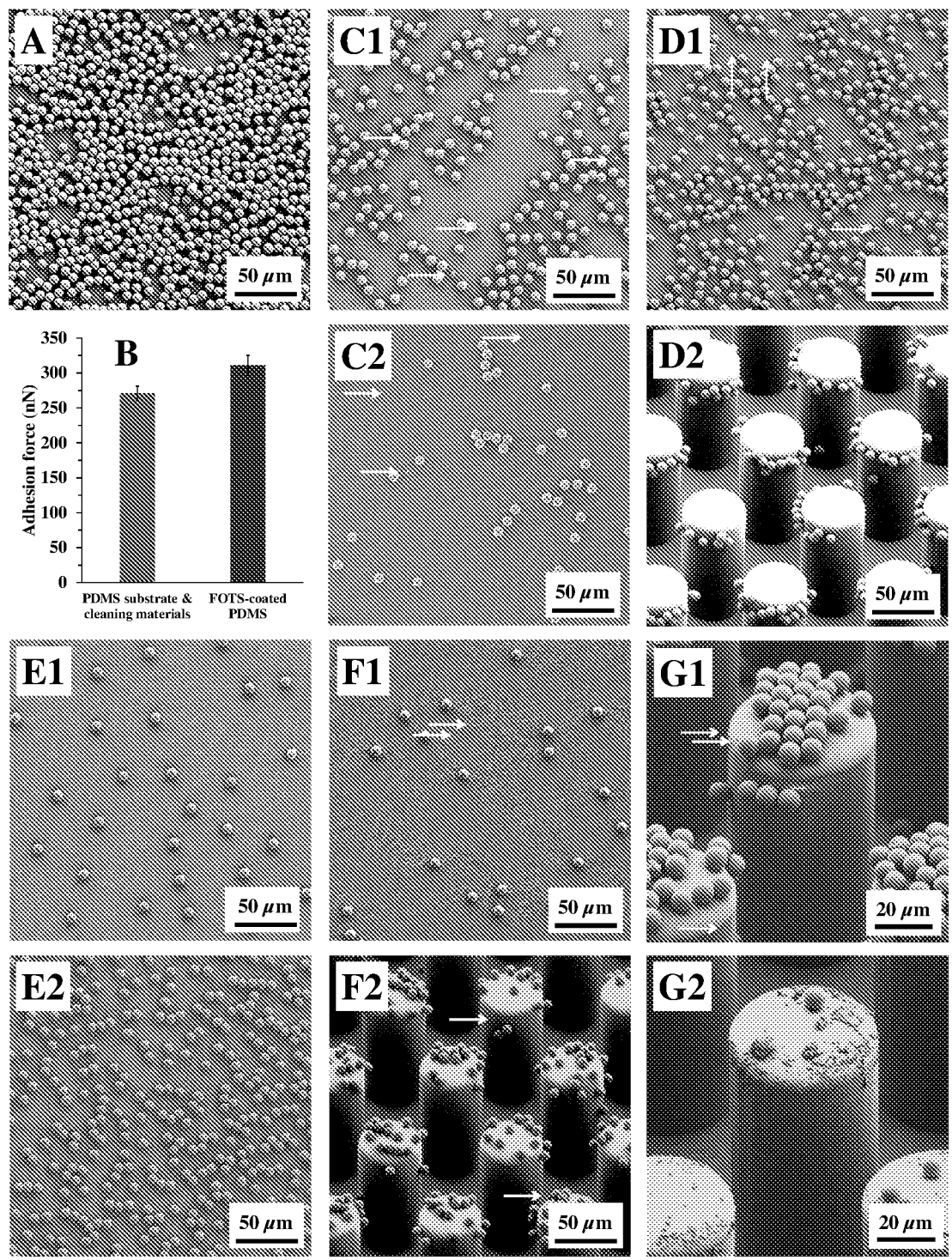
FIG. 10: (A) Scanning electron microscope (SEM) image from the surface of a PDMS thin film contaminated with a monolayer of 7.75 µm silica particles, and (B) adhesion of the same particles upon contact with both PDMS and FOTS-coated PDMS. (C1), (D1), (E1), and (F1) show the SEM images from the surface of PDMS thin films dusted with a monolayer of 7.75 µm silica particles, and cleaned using (C2) a flat PDMS sheet, (D2) 50 μm PDMS μ-dusters, (E2) a flat, FOTS-coated PDMS sheet, and (F2) 50 μm, FOTS-coated PDMS μ-dusters, respectively. (G1) and (G2) show the SEM images of two 50 μm FOTS-coated PDMS μ-dusters used to remove 7.75 μm silica particles from the surface of a PDMS substrate Images from the micropillars were taken from a 45° angle.

The softest selected substrate material is PDMS, the same polymer that has been used for the fabrication of all the cleaning materials in these experiments. FIG. 10.A shows a characteristic scanning electron microscope (SEM) image from the surface of a PDMS thin film, contaminated with a monolayer of 7.75 μm silica particles, while FIG. 10B depicts the interfacial interaction forces of the PDMS substrates and also those of the cleaning materials with silica particles. As can be seen in FIG. 10.C1 and D1, neither unstructured PDMS cleaning materials (FIG. 10.C2), nor PDMS μ-dusters (FIG. 10.D2) are able to effectively remove the contaminant particles from the surface of PDMS thin films.

As mentioned earlier, cleaning materials are required to develop stronger adhesion forces in comparison to the substrates. In that way, the cleaning materials can detach the contaminant particles from the surface of the substrates upon retraction from them. In the case of PDMS substrates, however, the adhesive properties of the cleaning materials are similar to those of the substrates (FIG. 10.B), which consequently inhibits the complete cleaning of PDMS thin films by using PDMS cleaning materials.

With reference to this result, it is reasonable to assume that if the PDMS cleaning materials were made stickier than the PDMS substrates, then it should be possible to remove silica particles from the surface of the substrates using PDMS cleaning materials. To test this hypothesis, surface of PDMS μ-dusters and also that of the flat control samples were coated with a self-assembled monolayer of a fluorine-based silane coupling agent, perfluorooctyl-trichlorosilane (FOTS). Coating the PDMS surface with a monolayer of FOTS helps to enhance the adhesion of PDMS to silica particles by improving the electrostatic interactions of the PMDS surface (FIG. 10.B). Although FOTS coating can enhance the adhesion of PDMS cleaning materials, it was observed that neither FOTS-coated flat sheets nor FOTS-coated μ-dusters can completely remove all silica particles from the surface of the PDMS thin films, while they demonstrated a more effective cleaning performance in comparison to uncoated cleaning materials (FIG. 10.E1 and F1). The inability of FOTS-coated cleaning materials in removing silica particles from the surface of PDMS thin films is because of the relatively large adhesion of these cleaning materials with silica particles. In the case of FOTS-coated μ-dusters, for instance, the large adhesion of the micropillars with the contaminant particles do not allow the particles to be displaced from the tip of the pillars (FIG. 10.F2). As a result, due to limited space at the tip of the hexagonally-patterned PDMS micropillars (with an effective contact area of ~39% of that of a flat sheet), FOTS-coated μ-dusters fail to remove all silica particles from the surface of PDMS substrates.

Like FOTS-coated μ-dusters, FOTS-coated flat sheets were also expected to clean all micrometric silica particles from the surface of PDMS thin films. However, due to the seemingly large adhesion of FOTS-coated cleaning sheets with the contaminant particles (see FIG. 10.E2), and consequently limited movability of particles over the surface of these cleaning materials, flat control samples could not remove all silica particles from the surface of PDMS substrates (FIG. 10.E1). The silica particles appear to be adsorbed at the surface of unstructured FOTS-coated sheets (FIG. 10.E2) and adhere very strongly to the surface of the cleaning materials. Due to their large adhesion, and so limited movability, adsorbed particles do not rearrange effectively at the surface of the cleaning sheets. Consequently, new particles cannot effectively find their way to the surface of the FOTS-coated PDMS flat sheets, leading to incomplete cleaning.

When PDMS substrates were cleaned with either PDMS or FOTS-coated PDMS cleaning materials, some particulate residues (marked by arrows in FIG. 10.C1, C2, D1, F1, F2, and G1) appear in spots at the surface of PDMS substrates and the cleaning materials. These residues appear to be fragments of the substrates and/or cleaning materials that have been detached from the surface during the cleaning process. Formation of these particle-like residues is most likely because of the large adhesion forces that PDMS and FOTS-coated PDMS cleaning materials generate upon contact with PDMS substrates (FIG. 10.B).

To better assess the formation of these particulate residues, one PDMS substrate was cleaned with three sheets of FOTS-coated PDMS μ-dusters. FIG. 10.G1 and G2 show the first and third μ-dusters that were employed for cleaning this PDMS substrate. As can be seen in FIG. 10.G2, large number of particle-like residues have appeared at the surface of the third cleaning material, while not many were present at the surface of the first one (FIG. 10.G1). Evidently, after removal of the majority of the silica particles with the first two cleaning materials, PDMS substrate could come into intimate contact with the third FOTS-coated PDMS μ-duster, and so effective interfacial interactions has formed between the two. As mentioned earlier, only electrostatic interaction forces that PDMS—and FOTS-coated PDMS—can develop upon intimate contact are large enough to cause deformations of this kind,[18, 19, 27, 30] leading to extensive formation of particulate residues when PDMS substrates were cleaned with either PDMS or FOTS-coated PDMS cleaning materials.

ii. Teflon AF

Figure 11:
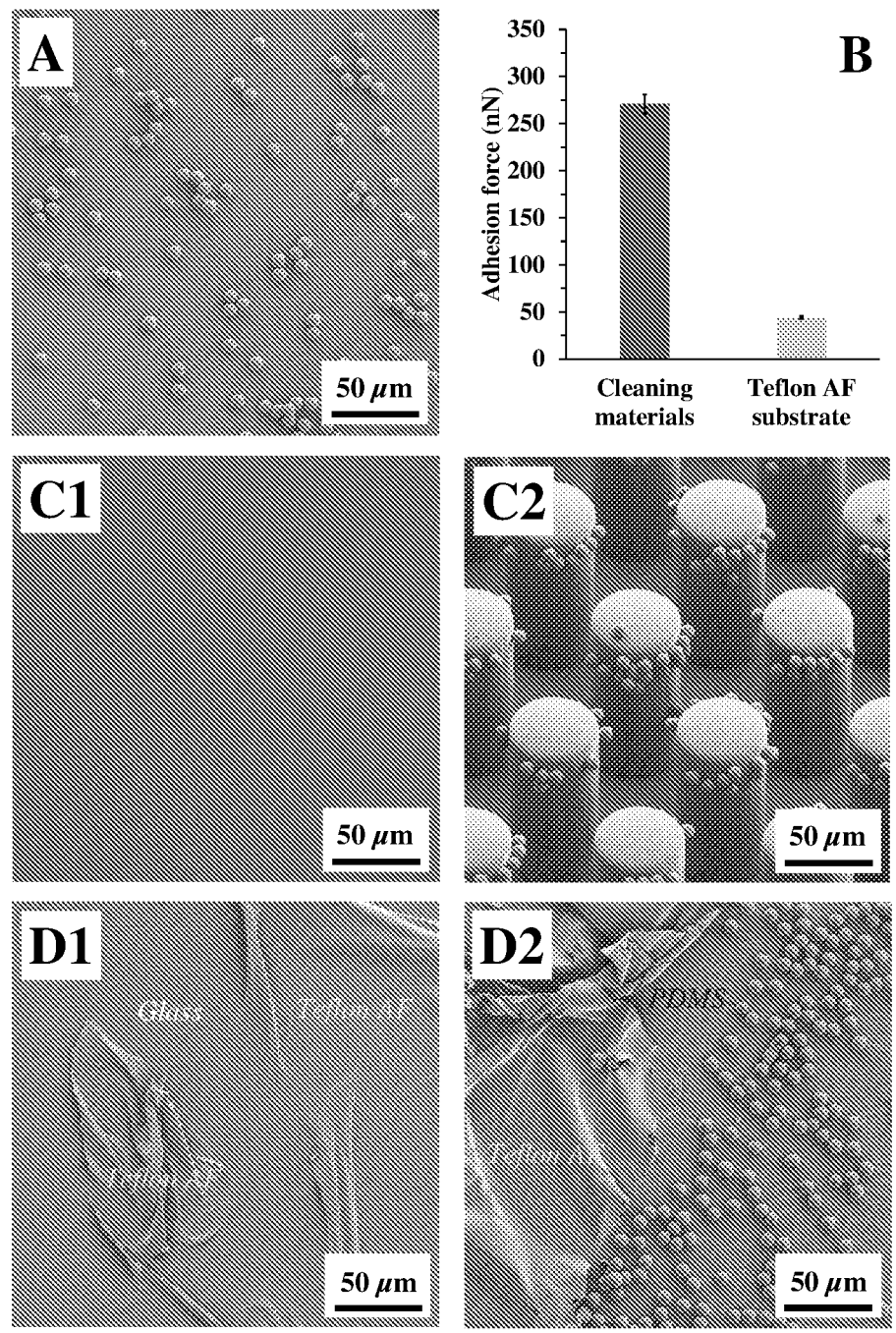
FIG. 11: (A) SEM image from the surface of a contaminated Teflon AF thin film, and (B) the relation between the adhesion of Teflon AF thin films and that of the cleaning materials. (C1) A contaminated Teflon AF thin film after removal of 7.75 μm silica particles from its surface by using (C2) 50 PDMS μ-dusters. (D1) Excessive damage formation at the surface of Teflon AF thin films when 7.75 μm silica particles were removed from the surface by using (D2) unstructured, flat PDMS sheets. SEM image of μ-dusters was taken from a 45° angle.

FIG. 11.A shows a representative SEM image from the surface of a contaminated Teflon AF substrate, while FIG. 11.C1 shows the same surface after removal of all 7.75 μm silica particles from that using 50 PDMS μ-dusters (FIG. 11.C2) Similar to PDMS μ-dusters, unstructured PDMS sheets are also very effective in removing micrometric silica particles from the surface of Teflon AF substrates (FIG. 11.D1). Even so, unlike PDMS μ-dusters, PDMS flat sheets cause significant damage to the surface of the Teflon AF thin films during the cleaning process. When using flat PDMS sheets as the cleaning material, it was observed that at many spots at the surface of the cleaned Teflon AF thin films, pieces of the Teflon AF thin films were torn apart (FIG. 11.D1) and adhered to the surface of the unstructured cleaning materials (FIG. 11.D2). Rupture formation at the surface of Teflon AF thin films is mainly because of the low adhesion of this polymer to the underlying glass substrates. Due to this small adhesion, the mechanical stresses that the sticky PDMS flat sheets apply to Teflon AF thin films during the cleaning process (particularly, upon detachment from the surface) leads to tearing of the these substrates. Some parts of the damaged thin films can even stick to the cleaning materials, as the PDMS sheets are retracted from the surface of the Teflon AF substrates.

Unlike unstructured PDMS sheets, PDMS μ-dusters did not cause any visible damage to the surface of Teflon AF thin films during the cleaning process (FIG. 11.C1). Their complete yet nondestructive cleaning is the result of two factors. When using PDMS micropillars as the cleaning materials, the larger adhesion of PDMS to silica particles (in comparison to that between the particles and Teflon AF) makes possible the removal of silica particles from the surface of Teflon AF thin films (FIG. 11.B). Also, the disclosed PDMS μ-dusters are essentially less sticky than unstructured, flat PDMS sheets. In general, fibrillar structures with flat tips and round edges (as μ-dusters of the present disclosure) have been shown to produce smaller adhesion forces in comparison to flat substrates of the same material.[41, 42] So, during a cleaning process, the adhesion-driven mechanical stress that PDMS μ-dusters develop with Teflon AF thin films are smaller than that of unstructured cleaning materials, which in turn helps to avoid damage formation at the surface of the Teflon AF substrates that are cleaned with PDMS μ-dusters.

iii. PMMA

Figure 12:
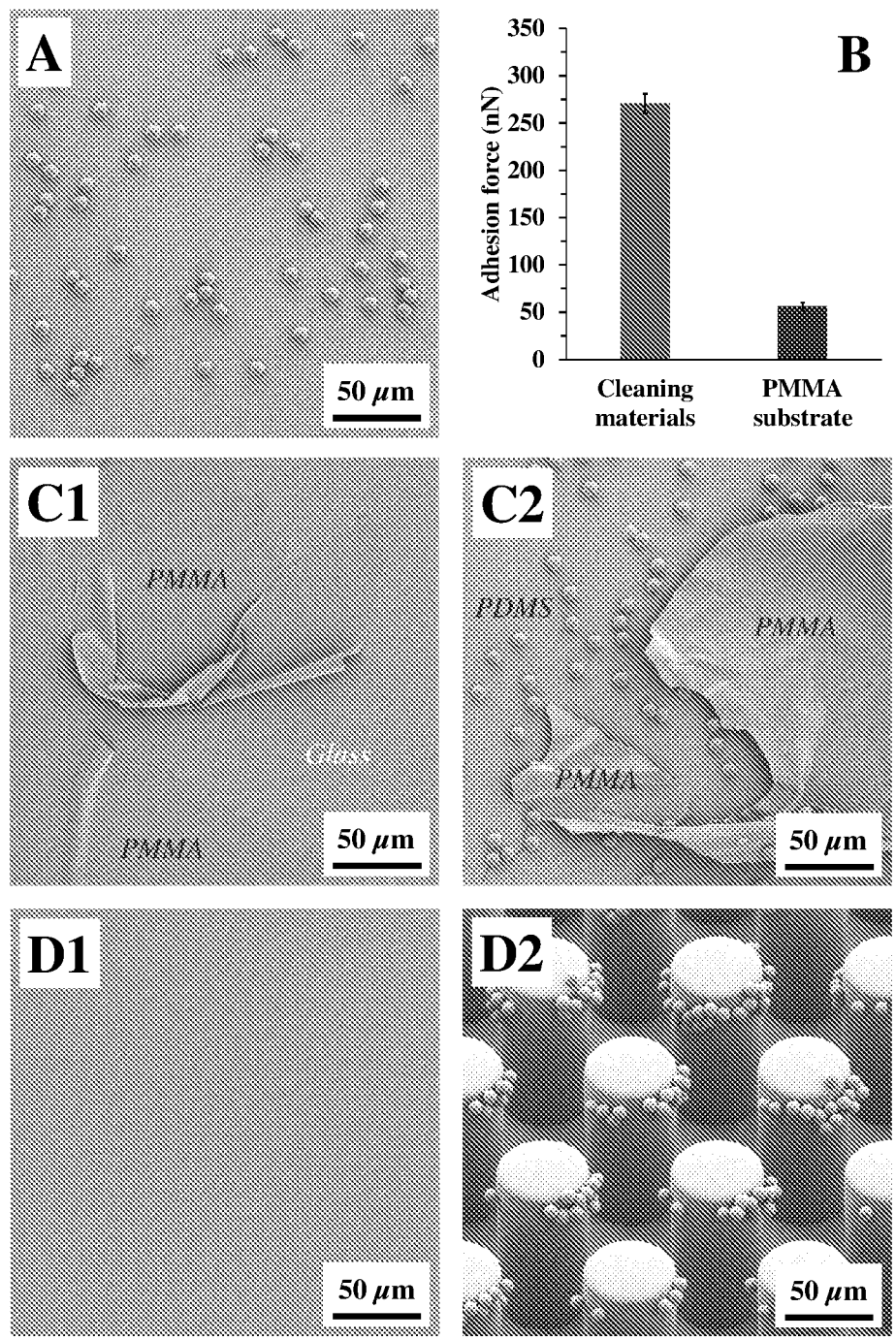
FIG. 12: (A) A PMMA thin film contaminated with a monolayer of 7.75 μm silica particles. (B) Adhesion of 7.75 μm silica particles upon contact with both PMMA substrates and PDMS cleaning materials. (C1) Flat PDMS cleaning materials can make excessive damage to the surface of PMMA substrates during the cleaning process, while pieces of the PMMA thin film may also stick to the surface of (C2) the unstructured PDMS cleaning materials. (D1) Effective and nondestructive removal of 7.75 μm contaminant particles from the surface of a PMMA substrate, using (D2) 50 PDMS μ-dusters. SEM image of PDMS micropillars was taken from a 45° angle.

FIG. 12.A shows a PMMA substrate contaminated with 7.75 μm silica particles, while FIG. 12.B shows the adhesion of these particles upon contact with PMMA substrates and also with the PDMS cleaning materials. As illustrated in FIG. 12.C1, similar to Teflon AF (see FIG. 11.D1), PMMA surfaces also rupture when they are cleaned with unstructured cleaning materials. Parts of the ruptured PMMA substrates also stick to the surface of the unstructured PDMS sheets (FIG. 12.C2). When using 50 PDMS μ-dusters, however, cleaning is again nondestructive, yet still very effective (FIG. 12.D1 and D2).

Very small macroscale adhesion of PDMS μ-dusters to PMMA substrates helps to mitigate the possibility of tear formation at the surface of PMMA thin films.[41, 42] Additionally, migration of particles from the tip to the side of the μ-duster fibrils during the cleaning process inhibits the accumulation of contaminant particles at the surface of the cleaning materials. In this way, PDMS μ-dusters can adsorb larger number of particles in comparison to unstructured cleaning materials, and can effectively remove all contaminant particles from the surface of the substrates. More importantly, movement of the particles from the tip to the side of the fibrils also mitigates the possibility of damage formation, particularly in the form of dents, at the surface of the PMMA thin films.

In the PMMA-related results reported above, it was demonstrated that PMMA substrates can be effectively and nondestructively dusted off by using PDMS μ-dusters. Unlike the PMMA substrate results reported in FIG. 12, the previously tested PMMA substrates did not tear apart when they were cleaned with flat PDMS sheets. The reason for the absence of tearing in the previous test results was the large adhesion between those PMMA thin films and the glass substrates under them. More specifically, in preparation of the previously described PMMA substrates, the surface of the underlying glass substrates were cleaned in an $O_2$/plasma chamber for about a minute before spin-coating the polymer on the backing glass coverslips. Cleaning glass with $O_2$/plasma exposes the functional groups of the glass surface,[43] and so enhances the adhesion between the PMMA thin films and the glass coverslips by promoting the formation of hydrogen bonds (and possibly covalent bonds)[15] at their interface. As a result, when $O_2$/plasma treated PMMA substrates were cleaned with unstructured cleaning materials, PMMA thin films held very strongly to the glass substrate under them, and so deformations only in the form of dents could be generated over the surface of those substrates during the cleaning process. Damage formation in the form of dents is basically because of the accumulation of particles—in localized regions—at the surface of the flat cleaning materials, leading to dent formation at the surface of the mechanically delicate PMMA substrates. In contrast to $O_2$/plasma treated samples as previously described, the low adhesion of untreated substrates of the presently described test results has resulted in tearing of these samples during the cleaning process (see FIG. 12.C1).

It is also noted that, unlike PMMA, $O_2$/plasma treatment could not help the less interfacially-active Teflon AF thin films to generate strong adhesion forces with the glass coverslips under them. As a result and as discussed in the previous subsection, Teflon AF substrates were also torn at some spots when they were cleaned with flat PDMS sheets (see FIG. 11.D1), even though the underlying glass substrates of all Teflon AF thin films were $O_2$/plasma treated for about a minute before coating the polymer thin films over them.

iv. Silica

Figure 13:
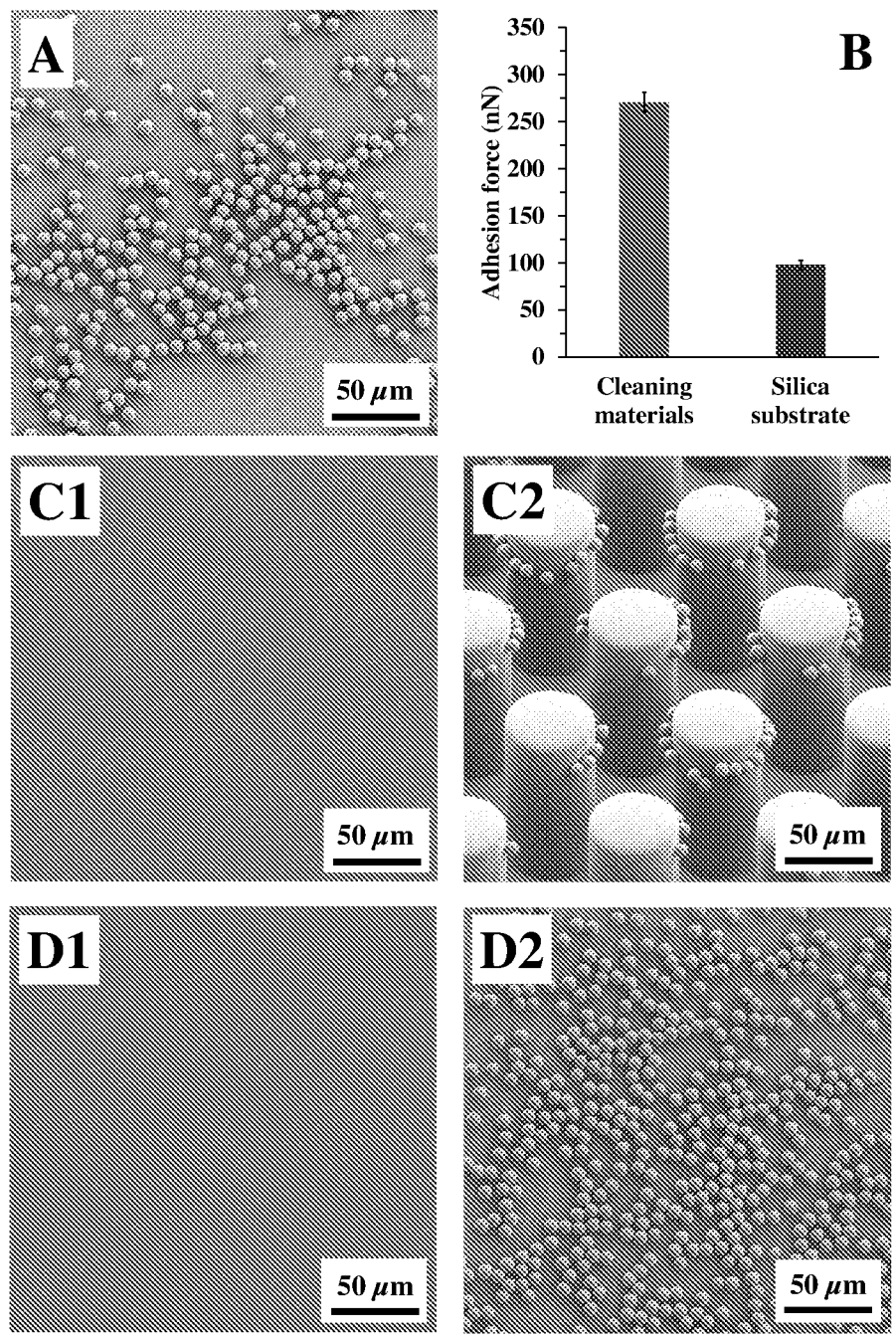
FIG. 13: (A1) SEM image of a silica substrate contaminated with a monolayer of 7.75 μm silica particles. (B) Adhesion of silica substrates—to 7.75 μm silica particles—in relation to the adhesion of PDMS cleaning materials to the same particles. (C1) Effective and nondestructive cleaning of 7.75 μm silica particles from the surface of a silica substrate, cleaned with (C2) 50 PDMS μ-dusters. (D1) Removal of the same particles from the surface of a silica substrate by using (D2) a flat PDMS sheet. SEM image of μ-dusters was taken from a 45° angle.

As can be seen in FIG. 13, both PDMS μ-dusters and flat PDMS sheets can effectively clean all 7.75 μm silica particles from the surface of silica substrates. Due to larger adhesion of the PDMS cleaning materials in comparison to that of the silica substrates (FIG. 13.B), both unstructured and structured PDMS cleaning sheets were successful in removing all particulate contaminates from the surface of silica substrates (FIG. 13.C1 and D1). Interestingly, because of the rigidity of the silica substrate, both PDMS μ-dusters (FIG. 13.C2), and flat PDMS sheets (FIG. 13.D2) caused no visible damage to the surface of the silica substrates during the cleaning process.

Considering the successful performance of both PDMS μ-dusters and flat PDMS sheets in removing micrometric silica particles from the surface of silica substrates, it might seem that using PDMS μ-dusters for cleaning silica substrates does not have any advantage over unstructured PDMS sheets. However, it should be noted that despite their nondestructive yet effective performance in removing micrometric contaminant particles, flat PDMS sheets are not very effective in cleaning submicrometric (0.26 μm) silica particles from the surface of silica substrates (see FIG. 14.A1, A2, B1, and B2). The inability of unstructured flat substrates in cleaning submicrometric particles has also been observed for cleaning particulate contamination from the surface of PMMA thin films.

Figure 14:
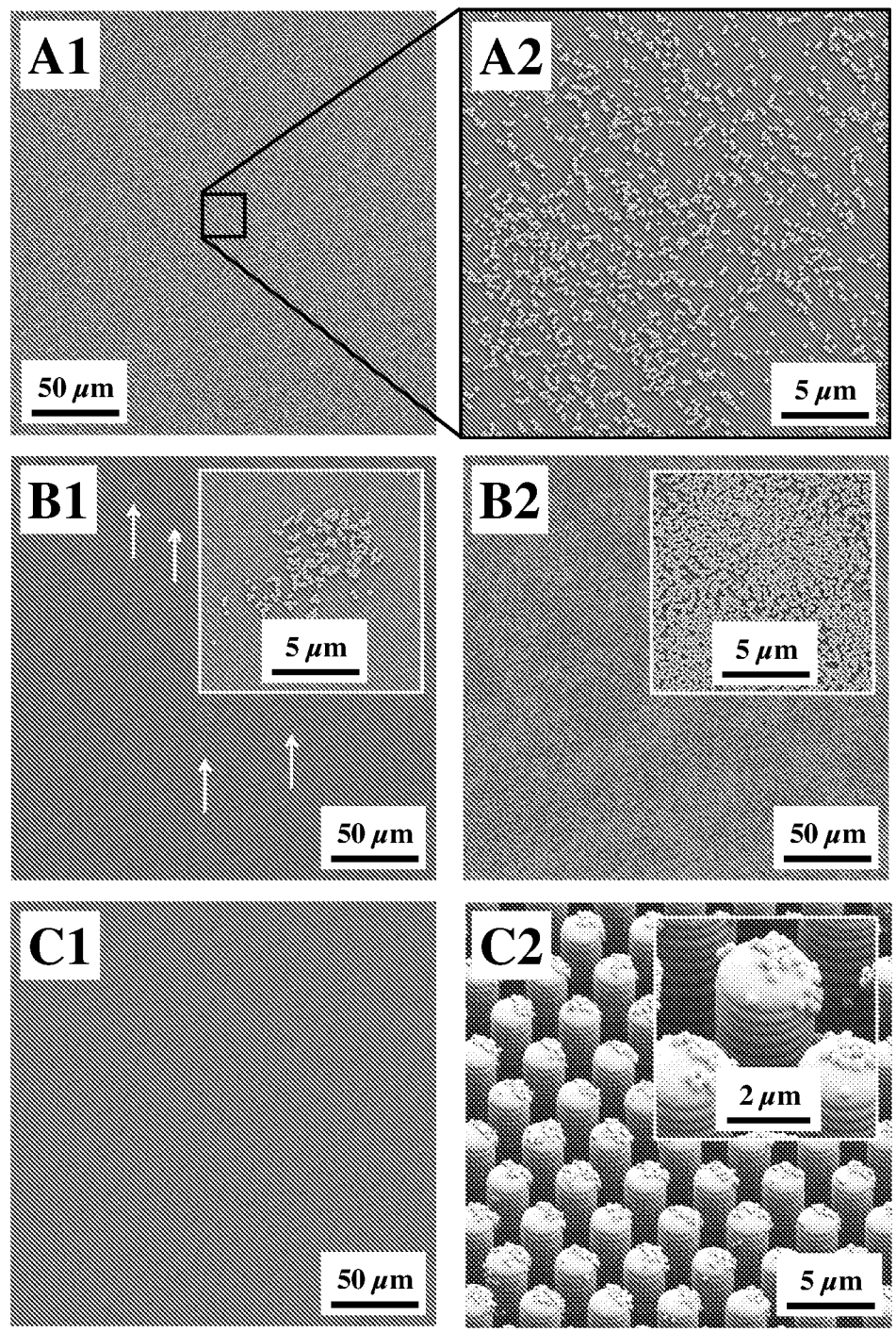
FIG. 14: (A1) and (A2) illustrate the SEM images of a silica substrate contaminated with a monolayer of 0.26 μm silica particles. (B1) SEM image from the surface of a silica substrate, contaminated with 0.26 μm silica particles and subsequently cleaned with (B2) an unstructured PDMS sheet. (C1) Effective and nondestructive cleaning of a silica substrate after removing 0.26 μm silica particles from its surface by using (C2) 2 μm PDMS μ-dusters. SEM images of PDMS μ-dusters were taken from a 45° angle.

Unlike unstructured PDMS sheets and as demonstrated in FIG. 14.C1, PDMS μ-dusters of adjusted geometrical properties (FIG. 14.C2) can effectively and nondestructively remove all submicrometric, 0.26 µm, silica particles from the surface of silica substrates. As previously noted, µ-dusters with dimensions not larger than approximately eight times the size of the particles are effective in removing spherical contaminant particles from solid surfaces. So, with larger adhesion of PDMS µ-dusters in comparison to that of silica substrates (FIG. 13.B) and by using PDMS µ-dusters of proper dimensions, submicrometric silica particles can be successfully removed from the surface of silica substrates (FIG. 14.C1), something that unstructured cleaning materials cannot achieve (see FIG. 14.B1).

j. µ-Dusting Applications

As demonstrated herein, PDMS µ-dusters are highly effective in removing micrometric—and also submicrometric—contaminant particles from the surface of various solid materials of distinct mechanical and interfacial properties. With the exception of the rubbery substrate of this study (PDMS), all other substrate materials, irrespective of their physical and mechanical properties, were successfully dusted off using µ-dusters of appropriate geometrical properties. Unlike PDMS µ-dusters, however, PDMS flat sheets, which were used as the control samples, made moderate and—in certain cases—excessive damage to the surface of the soft (PDMS) and semi-rigid (Teflon AF and PMMA) substrates. No visible damage was observed at the surface of the rigid (silica) substrates when they were cleaned with flat control samples. Even so, PDMS flat substrates were dysfunctional in removing submicrometric contaminant particles from the surface of silica substrates, while PDMS µ-dusters could effectively and nondestructively clean submicrometric silica particles from these rigid substrates.

In view of the effective yet nondestructive cleaning performance of PDMS µ-dusters, the disclosed dust cleaning materials can be effectively and advantageously employed for various precision dust cleaning applications in different fields of science and technology. Some of the delicate yet dust-sensitive materials and devices that can benefit from the nondestructive and effective dust cleaning performance of µ-dusters are integrated circuits, medical implants, and also delicate works of art.

Figure 15:
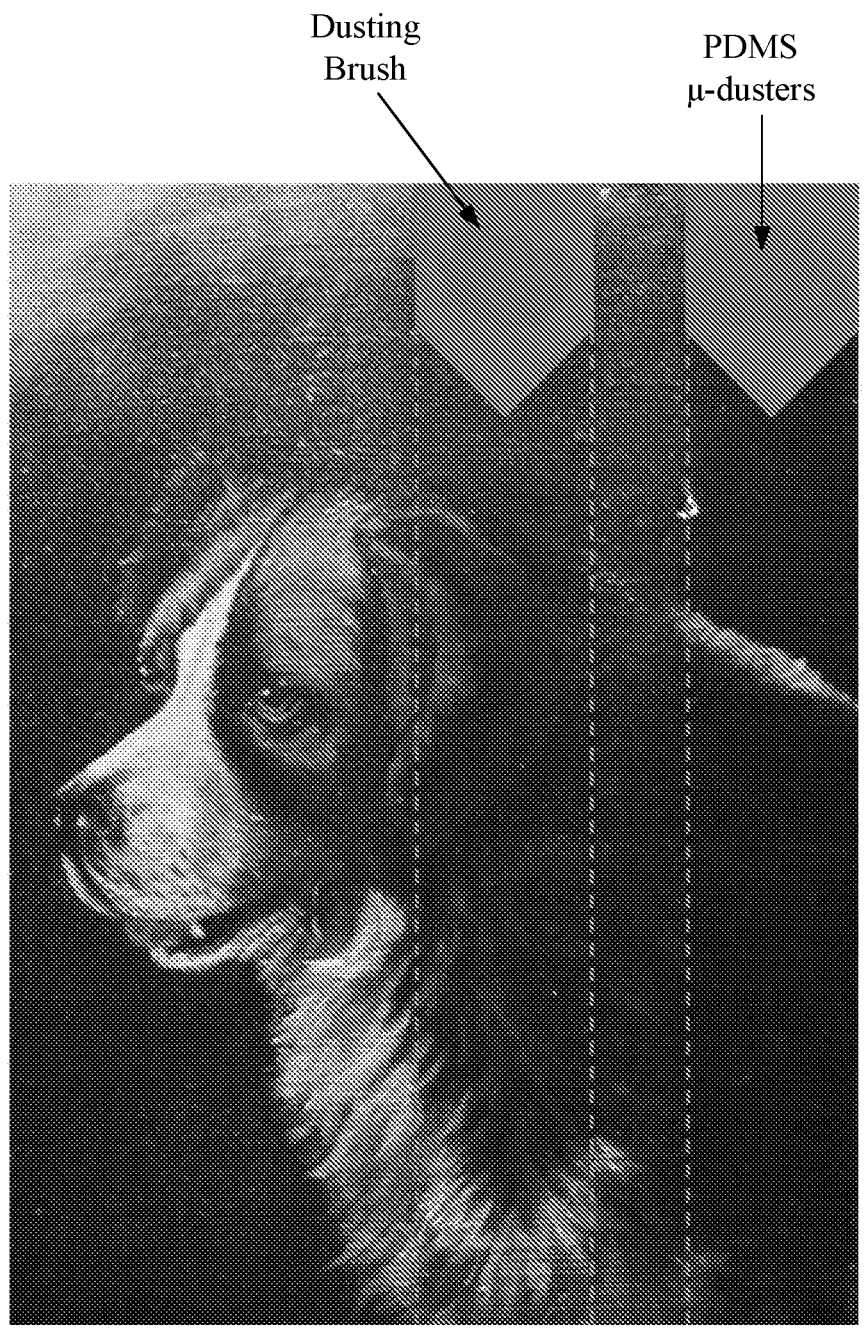
FIG. 15: An optical image from an oil painting (38.5×46.0 cm$^2$) that was naturally dusted for over a year. Two parts of the painting (with areas of ~6.0×46.0 cm$^2$) have been dusted off. One part was cleaned with PDMS μ-dusters and the other with a regular Hake dusting brush made from sheep hair bristles.

The highly effective performance of PDMS µ-dusters in removing dust particles from the surface of a relatively old and delicate oil painting is demonstrated with reference to FIG. 15. As can be seen in FIG. 15, PDMS µ-dusters have meticulously removed dust particles from the surface of this delicate work of art. Indeed, the cleaning performance of the disclosed PDMS µ-dusters outperformed the standard museum dusting brush that was also used to clean a part of this painting.

Figure 16:
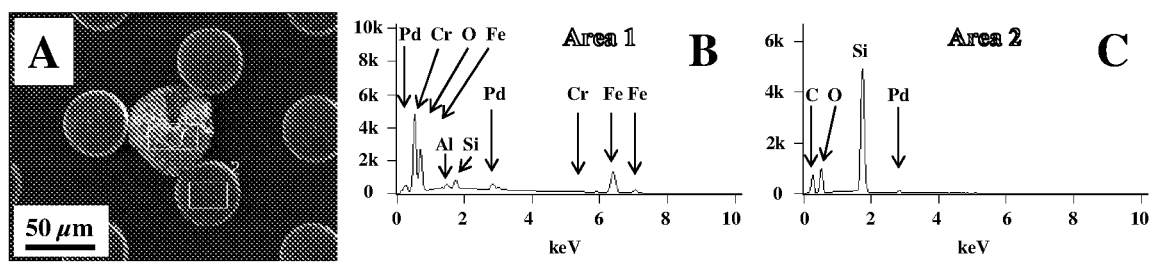
FIG. 16: (A) SEM image of a 50 PDMS μ-duster (with the aspect-ratio of ~0.4) after collecting random-size and random-composition dust particles from a stainless steel surface for characterization purposes. The chemical compositions of (B) the adsorbed dust particle and (C) the PDMS surface were further characterized by performing energy-dispersive X-ray spectroscopy (EDS).

In addition to dust cleaning applications, the gentle yet effective dust collecting performance of µ-dusters also make them an ideal candidate for nondestructive adsorption of dust particles for characterization purposes. For instance, as can be seen in FIG. 16.A, a PDMS µ-duster has been used for collecting contaminant particles from a stainless steel surface. In this exemplary application of the disclosed systems/methods, the removal of random-size and random-shape dust particles was carried out only to noninvasively collect the contaminant particles, so they can be subsequently characterized with respect to their chemical properties (FIGS. 16.B and C).

k. Experimental Procedure for Particulate Contamination Cleaning a. Materials. Teflon AF 1600 (a tetrafluoroethylene (TFE) (35 mol %) and 2,2-bis(trifluoromethyl)-4,5-difluoro-1,3-dioxole (PDD) (65 mol %) copolymer) was purchased from DuPont. Poly(methyl methacrylate) (PMMA, average molecular weight ($M_w$)≈350,000) was obtained from Sigma. Polydimethylsiloxane (PDMS), which was received as two-part Sylgard 184 Silicone Elastomer Kit, was acquired from Dow Corning. Round polished silica substrates (~25.4 mm in diameter, with the thickness of 0.20±0.05 mm) were obtained from Technical Glass Products, Inc. The Teflon AF solvent (Fluorinert Electronic Liquid FC-40) was obtained from 3M. Other solvents and chemicals, including anisole (ReagentPlus, ≥99%), pentane (anhydrous, ≥99%), chloroform (ReagentPlus, ≥99.8%), trichloro(octadecyl)silane (OTS, ≥90%), and trichloro(1H,1H,2H,2H-perfluorooctyl)silane (FOTS, ≥97%), were purchased from Sigma. Monodisperse silica microspheres (with nominal diameters of 0.26 and 7.75 µm (coefficient of variation <10%)) were purchased from Cospheric LLC. Ultra-smooth, mirror-finished copper sheets (99%, 28 gauge) were obtained from Fire Mountain Gems and Beads. Preparation of copper sheets for spin-coating the polymer thin films was carried out according to a procedure reported elsewhere.[18] The oil painting (an oil on canvas of a dog by Mary Emma Fairbanks Smith (born 1844)) is part of the study collection of the Institute for the Preservation of Cultural Heritage (IPCH) at Yale University (donated by Channing Harris). Prior to dust removal, the painting was stored in a closed cabinet, where it naturally adsorbed a dust layer, accumulated on the painting surface over a year. There is no known previous conservation treatment on this painting.

Fabrication.

µ-dusters (PDMS micropillars, 2, 5, and 50 µm in diameter, with aspect ratios of ~2, and in one particular case, 0.4) and flat control samples were fabricated by replica-molding, using silicon master-molds. Polymeric substrates were fabricated by spin-coating the polymer precursor solutions onto glass coverslips (2.2×2.2×0.1 cm³, from VWR International LLC.) using a WS-400-6NPP Spin Coater (Laurell Technologies Corporation). The corresponding polymer precursor solution, concentration (C), spin speed (co), and spin time (t) are detailed in Table 2 above.

Characterization.

Polarities (i.e., hydrophobicity and hydrophilicity) of the samples were analyzed by static water contact angle measurement tests. In these tests, the static contact angle of a (6-10 µL) water droplet on each sample was measured using a NRL Contact Angle Goniometer (ramé-hart, inc.). Roughness parameters of the samples were determined by atomic force microscopy (AFM) from a 5×5 µm² area from the surface of the samples using a Dimension FastScan Atomic Force Microscope (Bruker Corporation). The thickness of the polymer substrates were measured by thin film step height measurement, using an Alpha-Step 200 Profilometer (KLA-Tencor Corporation). Adhesion forces between silica particles and the substrates were measured on a Dimension Icon AFM instrument (Bruker Corporation).

To evaluate the cleaning quality of our samples, scanning electron microscope (SEM) images were taken from the surface of the substrates and the cleaning materials, using an Ultra-High-Resolution Analytical FE-SEM (SU-70, Hitachi High-Technologies Corporation) operating at 2-5 kV. Charge measurement for Teflon AF was carried out by image charge analysis. Cleaning of the oil painting with PDMS µ-dusters was carried out in a progressive manner, using 50 µm pillars first, then 5 µm pillars, and at the end, 2 µm pillars. Collecting dust particles from the stainless steel surface, by using 50 µm µ-dusters (with aspect-ratio of ~0.4), was carried at Indium Corporation. SEM and energy-dispersive X-ray spectroscopy (EDS) of these samples were also carried out at Indium Corporation and on a JSM-6480LV SEM (from JEOL, Ltd.). In preparation for these tests, all samples were coated with a nanolayer of palladium. Indium Corporation has a proprietary right to the composition and function of the stainless steel substrate that was cleaned with PDMS µ-dusters.

As is apparent from the relative quality of the cleaning operations, the PDMS µ-dusters of the present disclosure yielded superior results as compared to a conventional Hake dusting brush made from sheep hair bristles.

Wide Ranging Applications for Disclosed Systems/Methods

As disclosed herein, µ-dusters may be advantageously employed for removing contaminant particles from the surface of different solid substrates of distinct mechanical and interfacial properties. With the exception of rubbery substrates discussed herein below, the disclosed µ-dusters of tailored interfacial and geometrical properties can effectively and nondestructively remove particulate contamination from the surface of all other substrates, irrespective of their mechanical and interfacial properties. Unlike the disclosed µ-dusters, unstructured cleaning materials, used as the control samples, either cause moderate and—in certain cases—excessive damage to the surface of the substrates, or they fail to deliver an effective cleaning performance.

Removal of particulate contamination (loosely referred to as dust) from solid surfaces is of fundamental interest and technological importance in a wide variety of industries, including microelectronics, aerospace, optics, biomedical sciences, xerography, adhesive bonding, and art conservation. Dust particles can have adverse impact on performance of dust-sensitive materials and devices, like integrated circuits (ICs) and medical implants, while they can even cause damage to museum objects and rob the vitality of paintings' colors. Because of that, billions of dollars are spent every year to remove particulate contamination from delicate and dust-sensitive materials. In the microelectronics industry, for instance, it is expected that over five billion dollars will be spent in 2017 for the production and maintenance of equipment used for cleaning semiconductor wafers. In a typical semiconductor wafer processing (e.g., production of ICs), over a quarter of the processing steps, which can be as many as 800, involve the removal particulate contamination from the surface, which accordingly necessitates the implementation of a variety of versatile and effective dust cleaning methods. The rapid miniaturization of many of these materials and devices is making them even more delicate and prone to contamination, increasing the demand for advanced dust cleaning techniques that provide higher precision and little to no destruction.

The disclosed µ-dusters consist of soft and flexible polymeric microstructures, outgrown over a soft polymeric substrate. Once a µ-duster is brought into contact with a contaminated substrate, the polymeric microfibrils at the surface of the cleaning material develop intimate contact with the contaminated surface. By developing intimate contact, the microfibrils of µ-dusters form strong adhesion forces with the contaminant particles, stronger than those between the particles and the substrate. While the adhesion forces with the contaminant particles are very strong, the interfacial interactions of µ-dusters with the substrate itself are minimal, as a result of the advantageous geometrical properties of the disclosed microstructural cleaning materials. By producing strong adhesion with the dust particles, while having minimal interfacial interactions with the substrate, polymeric µ-dusters of the present disclosure can effectively and nondestructively detach the contaminant particles from the contaminated surface.

Different materials of various mechanical and interfacial properties have been contaminated with model dust particles of different dimensions, and subsequently cleaned using µ-dusters of different interfacial and geometrical properties to establish the efficacy of the disclosed systems and methods.

The systems and methods of the present disclosure are described with reference to exemplary embodiments and implementations thereof. However, the present disclosure is not limited by or to such exemplary embodiments and/or implementations. Rather, the present disclosure may be implemented in various ways that nonetheless fall within both the spirit and scope of the present disclosure, as will be readily apparent to those of ordinary skill in the art from the description provided herein. The present disclosure expressly encompasses such changes, modifications and variations as will be apparent to skilled practitioners from the present disclosure.

REFERENCES FOR INITIAL DISCUSSION
(PAGES 1-35)

(1) Mittal, K. L. *Treatise on Clean Surface Technology*; Plenum Press: USA, 1987.
(2) Mittal, K. L. *Particles on Surfaces: Detection, Adhesion, and Removal*; Plenum Press: USA, 1994.
(3) Kohli, R.; Mittal, K. L. *Developments in Surface Contamination and Cleaning: Fundamentals and Applied Aspects*; William Andrew: USA, 2008.
(4) Kohli, R.; Mittal, K. L. *Developments in Surface Contamination and Cleaning: Methods for Removal of Particle Contaminants*; William Andrew: UK, 2011.
(5) Pulker, H. K. *Coatings on Glass*; Elsevier: Netherlands, 1999.
(6) Gale, G. W.; Busnaina, A. A. Removal of Particulate Contaminants using Ultrasonics and Megasonics: A Review. *Part. Sci. Technol.* 1995, 13, 197-211.
(7) Tam, A. C.; Leung, W. P.; Zapka, W.; Ziemlich, W. Laser-Cleaning Techniques for Removal of Surface Particulates. *J. Appl. Phys.* 1992, 71, 3515-3523.
(8) Sherman, R.; Grob, J.; Whitlock, W. Dry Surface Cleaning using $CO_2$ Snow. *J. Vac. Sci. Technol., B: Microelectron. Process. Phenom.* 1991, 9, 1970-1977.
(9) Mosbacher, M.; Münzer, H.; Zimmermann, J.; Solis, J.; Boneberg, J.; Leiderer, P. Optical Field Enhancement Effects in Laser-Assisted Particle Removal. *Appl. Phys. A: Mater. Sci. Process.* 2001, 72, 41-44.
(10) Israelachvili, J. N. *Intermolecular and Surface Forces*; Academic Press: USA, 2011.
(11) Zimon, A. D. *Adhesion of Dust and Powder*; Plenum: USA, 1982.
(12) Horn, R. G.; Smith, D. T. Contact Electrification and Adhesion between Dissimilar Materials. *Science* 1992, 256, 362-364.
(13) Horn, R. G.; Smith, D. T.; Grabbe, A. Contact Electrification Induced by Monolayer Modification of a Surface and Relation to Acid-Base Interactions. *Nature* 1993, 366, 442-443.
(14) From the Product Specifications Reported by the Producer.
(15) Clayton, L. M.; Sikder, A. K.; Kumar, A.; Cinke, M.; Meyyappan, M.; Gerasimov, T. G.; Harmon, J. P. Transparent Poly (Methyl Methacrylate)/Single-Walled Carbon Nanotube (PMMA/SWNT) Composite Films with Increased Dielectric Constants. *Adv. Funct. Mater.* 2005, 15, 101-106.

(16) Johnson, K.; Kendall, K.; Roberts, A. Surface Energy and the Contact of Elastic Solids. *Proc. R. Soc. London, Ser.* A 1971, 324, 301-313.

(17) Zappone, B.; Rosenberg, K. J.; Israelachvili, J. Role of Nanometer Roughness on the Adhesion and Friction of a Rough Polymer Surface and a Molecularly Smooth Mica Surface. *Tribol. Lett.* 2007, 26, 191-201.

(18) Rabinovich, Y. I.; Adler, J. J.; Ata, A.; Singh, R. K.; Moudgil, B. M. Adhesion between Nanoscale Rough Surfaces: I. Role of Asperity Geometry. *J. Colloid Interface Sci.* 2000, 232, 10-16.

(19) Haynes, W. M. *CRC Handbook of Chemistry and Physics*; CRC Press: USA, 2014.

(20) Drelich, J. Adhesion Forces Measured between Particles and Substrates with Nano-Roughness. *Miner. Metall. Process.* 2006, 23, 226-232.

(21) Huber, G.; Mantz, H.; Spolenak, R.; Mecke, K.; Jacobs, K.; Gorb, S. N.; Arzt, E. Evidence for Capillarity Contributions to Gecko Adhesion from Single Spatula Nanomechanical Measurements. *Proc. Natl. Acad. Sci. U.S.A.* 2005, 102, 16293-16296.

(22) Apodaca, M. M.; Wesson, P. J.; Bishop, K. J.; Ratner, M. A.; Grzybowski, B. A. Contact Electrification between Identical Materials. *Angew. Chem., Int. Ed.* 2010, 122, 958-961.

(23) Lowell, J.; Rose-Innes, A. Contact Electrification. *Adv. Phys.* 1980, 29, 947-1023.

(24) Izadi, H.; Golmakani, M.; Penlidis, A. Enhanced Adhesion and Friction by Electrostatic Interactions of Double-Level Teflon Nanopillars. *Soft Matter* 2013, 9, 1985-1996.

(25) Izadi, H.; Penlidis, A. Polymeric Bio-Inspired Dry Adhesives: Van der Waals or Electrostatic Interactions? *Macromol. React. Eng.* 2013, 7, 588-608.

(26) Lacks, D. J.; Sankaran, R. M. Contact Electrification of Insulating Materials. *J. Phys. D: Appl. Phys.* 2011, 44, 453001.

(27) Izadi, H.; Stewart, K. M.; Penlidis, A. Role of Contact Electrification and Electrostatic Interactions in Gecko Adhesion. *J. R. Soc. Interface* 2014, 11, 20140371.

(28) Schönenberger, C. Charge Flow during Metal-Insulator Contact. *Phys. Rev. B: Condens. Matter Mater. Phys.* 1992, 45, 3861.

(29) Terris, B.; Stern, J.; Rugar, D.; Mamin, H. Contact Electrification using Force Microscopy. *Phys. Rev. Lett.* 1989, 63, 2669.

(30) Hu, S.; Xia, Z. Rational Design and Nanofabrication of Gecko-Inspired Fibrillar Adhesives. *Small* 2012, 8, 2464-2468.

(31) Boesel, L. F.; Greiner, C.; Arzt, E.; del Campo, A. Gecko-Inspired Surfaces: A Path to Strong and Reversible Dry Adhesives. *Adv. Mater.* 2010, 22, 2125-2137.

(32) del Campo, A.; Greiner, C.; Arzt, E. Contact Shape Controls Adhesion of Bioinspired Fibrillar Surfaces. *Langmuir* 2007, 23, 10235-10243.

(33) Hansen, W.; Autumn, K. Evidence for Self-Cleaning in Gecko Setae. *Proc. Natl. Acad. Sci. U.S.A.* 2005, 102, 385-389.

(34) Hu, S.; Lopez, S.; Niewiarowski, P. H.; Xia, Z. Dynamic Self-Cleaning in Gecko Setae via Digital Hyperextension. *J. R. Soc. Interface* 2012, 9, 2781-2790.

(35) Menguc, Y.; Rohrig, M.; Abusomwan, U.; Holscher, H.; Sitti, M. Staying Sticky: Contact Self-Cleaning of Gecko-Inspired Adhesives. *J. R. Soc. Interface* 2014, 11, 20131205.

(36) Abusomwan, U. A.; Sitti, M. Mechanics of Load-Drag-Unload Contact Cleaning of Gecko-Inspired Fibrillar Adhesives. *Langmuir* 2014, 30, 11913-11918.

(37) Landman, U.; Luedtke, W. D.; Burnham, N. A.; Colton, R. J. Atomistic Mechanisms and Dynamics of Adhesion, Nanoindentation, and Fracture. *Science* 1990, 248, 454-461.

(38) Thomas, S. W.; Vella, S. J.; Kaufman, G. K.; Whitesides, G. M. Patterns of Electrostatic Charge and Discharge in Contact Electrification. *Angew. Chem., Int. Ed.* 2008, 120, 6756-6758.

(39) Thomas, S. W.; Vella, S. J.; Dickey, M. D.; Kaufman, G. K.; Whitesides, G. M. Controlling the Kinetics of Contact Electrification with Patterned Surfaces. *J. Am. Chem. Soc.* 2009, 131, 8746-8747.

(40) Li, Q.; Elimelech, M. Organic Fouling and Chemical Cleaning of Nanofiltration Membranes: Measurements and Mechanisms. *Environ. Sci. Technol.* 2004, 38, 4683-4693.

(41) Hutter, J. L.; Bechhoefer, J. Calibration of Atomic-Force Microscope Tips. *Rev. Sci. Instrum.* 1993, 64, 1868-1873.

(42) Hertz, H. Miscellaneous Papers; Macmillan: UK, 1896.

(43) Greiner, C.; del Campo, A.; Arzt, E. Adhesion of Bioinspired Micropatterned Surfaces: Effects of Pillar Radius, Aspect Ratio, and Preload. *Langmuir* 2007, 23, 3495-3502.

(44) Baytekin, H. T.; Baytekin, B.; Soh, S.; Grzybowski, B. A. Is Water Necessary for Contact Electrification? *Angew. Chem., Int. Ed.* 2011, 50, 6766-6770.

(45) Ireland, P. M. Contact Charge Accumulation and Separation Discharge. *J. Electrost.* 2009, 67, 462-467.

(46) Brennan, W.; Lowell, J.; O'Neill, M.; Wilson, M. Contact Electrification: The Charge Penetration Depth. *J. Phys. D: Appl. Phys.* 1992, 25, 1513.

REFERENCES FOR DISCUSSION AT PAGES 37-45

1. Izadi, H.; Dogra, N.; Perreault, F.; Schwarz, C.; Simon, S.; Vanderlick, T. K. *ACS Appl. Mater. Interfaces.* 2016, 16967-16978.

2. Ireland, P. M. *J. Electrost.* 2009, 2, 462-467.

3. Israelachvili, J. N. *Intermolecular and Surface Forces*; Academic Press: USA, 2011.

4. Brennan, W.; Lowell, J.; O'Neill, M.; Wilson, M. *J. Phys. D: Appl. Phys.* 1992, 10, 1513-1517.

5. Huber, G.; Mantz, H.; Spolenak, R.; Mecke, K.; Jacobs, K.; Gorb, S. N.; Arzt, E. *Proc. Natl. Acad. Sci. U.S.A.* 2005, 45, 16293-16296.

6. Izadi, H.; Stewart, K. M.; Penlidis, A. *J. R. Soc. Interface* 2014, 98, 20140371.

7. Rabinovich, Y. I.; Adler, J. J.; Ata, A.; Singh, R. K.; Moudgil, B. M. *J. Colloid Interface Sci.* 2000, 1, 10-16.

8. Johnson, K.; Kendall, K.; Roberts, A. *Proc. R. Soc. London, Ser. A.* 1971, 1558, 301-313.

9. Olsen, D. A.; Osteraas, A. *J. J. Phys. Chem.* 1964, 9, 2730-2732.

10. Ozcan, C.; Hasirci, N. *J. Appl. Polym. Sci.* 2008, 1, 438-446.

11. Scheirs, J. *Modern Fluoropolymers: High Performance Polymers for Diverse Applications*; Wiley: UK, 1997.

12. Robinson, A. P.; Minev, I.; Graz, I. M.; Lacour, S. P. *Langmuir* 2011, 8, 4279-4284.

13. Greiner, C.; del Campo, A.; Arzt, E. *Langmuir* 2007, 7, 3495-3502.

14. Greaves, G. N.; Greer, A.; Lakes, R.; Rouxel, T. *Nat. Mater.* 2011, 11, 823-837.

15. Haynes, W. M. *CRC Handbook of Chemistry and Physics*; CRC Press: USA, 2014.

16. Izadi, H.; Penlidis, A. *Macromol. React. Eng.* 2013, 11, 588-608.
17. From the product specifications reported by the producer.
18. Clayton, L. M.; Sikder, A. K.; Kumar, A.; Cinke, M.; Meyyappan, M.; Gerasimov, T. G.; Harmon, J. P. *Adv. Funct. Mater.* 2005, 1, 101-106.

REFERENCES FOR DISCUSSION AT PAGES 45-66

1. Kohli, R.; Mittal, K. L. *Developments in Surface Contamination and Cleaning: Fundamentals and Applied Aspects*; William Andrew: USA, 2015; Vol. 1.
2. Kohli, R.; Mittal, K. L. *Developments in Surface Contamination and Cleaning: Methods for Removal of Particle Contaminants*; William Andrew: UK, 2011; Vol. 3.
3. Kohli, R.; Mittal, K. L. *Developments in Surface Contamination and Cleaning: Particle Deposition, Control, and Removal*; William Andrew: USA, 2009; Vol. 2.
4. Mittal, K. L. *Particles on Surfaces: Detection, Adhesion, and Removal*; Plenum Press: USA, 1994.
5. Baglioni, P.; Chelazzi, D. *Nanoscience for the Conservation of Works of Art*; Royal Society of Chemistry: UK, 2013.
6. Reinhardt, K.; Kern, W. *Handbook of Silicon Wafer Cleaning Technology*; William Andrew: USA, 2008.
7. Abraham, R. *Microelectronics & Semiconductor Device/Wafer Cleaning Equipment Market*; MarketsandMarkets: USA, 2016.
8. Elliott, D. L. *Ultraviolet Laser Technology and Applications*; Academic Press: UK, 2014.
9. Okorn-Schmidt, H. F.; Holsteyns, F.; Lippert, A.; Mui, D.; Kawaguchi, M.; Lechner, C.; Frommhold, P. E.; Nowak, T.; Reuter, F.; Piqué, M. B. *ECS J. Solid State Sci. Technol.* 2014, 1, N3069-N3080.
10. Gale, G. W.; Busnaina, A. A. *Part. Sci. Technol.* 1995, 3-4, 197-211.
11. Tam, A. C.; Leung, W. P.; Zapka, W.; Ziemlich, W. *J. Appl. Phys.* 1992, 7, 3515-3523.
12. Sherman, R.; Grob, J.; Whitlock, W. *J. Vac. Sci. Technol., B: Microelectron. Process. Phenom.* 1991, 4, 1970-1977.
13. Mosbacher, M.; Münzer, H.; Zimmermann, J.; Solis, J.; Boneberg, J.; Leiderer, P. *Appl. Phys. A: Mater. Sci. Process.* 2001, 1, 41-44.
14. Omitted.
15. Israelachvili, J. N. *Intermolecular and Surface Forces*; Academic Press: USA, 2011.
16. Harper, W. R. *Contact and Frictional Electrification*; Laplacian Press: USA, 1967.
17. Lowell, J.; Rose-Innes, A. *Adv. Phys.* 1980, 6, 947-1023.
18. Izadi, H.; Stewart, K. M.; Penlidis, A. *J. R. Soc. Interface* 2014, 98, 20140371.
19. Izadi, H.; Penlidis, A. *Macromol. React. Eng.* 2013, 11, 588-608.
20. Zappone, B.; Rosenberg, K. J.; Israelachvili, J. *Tribol. Lett.* 2007, 3, 191-201.
21. Rabinovich, Y. I.; Adler, J. J.; Ata, A.; Singh, R. K.; Moudgil, B. M. *J. Colloid Interface Sci.* 2000, 1, 10-16.
22. Johnson, K.; Kendall, K.; Roberts, A. *Proc. R. Soc. London, Ser. A.* 1971, 1558, 301-313.
23. Drelich, J. *Miner. Metall. Proc.* 2006, 4, 226-232.
24. Haynes, W. M. *CRC Handbook of Chemistry and Physics*; CRC Press: USA, 2014.
25. Huber, G.; Mantz, H.; Spolenak, R.; Mecke, K.; Jacobs, K.; Gorb, S. N.; Arzt, E. *Proc. Natl. Acad. Sci. U.S.A.* 2005, 45, 16293-16296.
26. Apodaca, M. M.; Wesson, P. J.; Bishop, K. J.; Ratner, M. A.; Grzybowski, B. A. *Angew. Chem. Int. Ed.* 2010, 5, 958-961.
27. Horn, R. G.; Smith, D. T. *Science* 1992, 5055, 362-364.
28. Izadi, H.; Golmakani, M.; Penlidis, A. *Soft Matter* 2013, 6, 1985-1996.
29. Izadi, H.; Sarikhani, K.; Penlidis, A. *Nanotechnology* 2013, 50, 505306.
30. Horn, R. G.; Smith, D. T.; Grabbe, A. *Nature* 1993, 442-443.
31. McGuiggan, P. M. *Langmuir* 2008, 8, 3970-3976.
32. Wan, K.; Smith, D. T.; Lawn, B. R. *J. Am. Ceram. Soc.* 1992, 3, 667-676.
33. McCarty, L. S.; Whitesides, G. M. *Angew. Chem. Int. Ed.* 2008, 12, 2188-2207.
34. Terris, B.; Stern, J.; Rugar, D.; Mamin, H. *Phys. Rev. Lett.* 1989, 24, 2669-2672.
35. Schönenberger, C. *Phys. Rev. B* 1992, 7, 3861-3864.
36. Scheirs, J. *Modern Fluoropolymers: High Performance Polymers for Diverse Applications*; Wiley: UK, 1997.
37. Ramanathan, T.; Abdala, A.; Stankovich, S.; Dikin, D.; Herrera-Alonso, M.; Piner, R.; Adamson, D.; Schniepp, H.; Chen, X.; Ruoff, R. *Nat. Nanotechnol.* 2008, 6, 327-331.
38. Lee, W.; Chang, J.; Ju, S. *Langmuir* 2010, 15, 12640-12647.
39. Dunitz, J. D.; Taylor, R. *Chem. Eur. J.* 1997, 1, 89-98.
40. Zhuravlev, L. *Colloids Surf.*, A. 2000, 1, 1-38.
41. Boesel, L. F.; Greiner, C.; Arzt, E.; del Campo, A. *Adv. Mater.* 2010, 19, 2125-2137.
42. del Campo, A.; Greiner, C.; Arzt, E. *Langmuir* 2007, 20, 10235-10243.
43. Bowen, W. R.; Hilal, N.; Lovitt, R. W.; Wright, C. *J. Colloids Surf,* A 1999, 1, 117-125.

The invention claimed is:

1. A method for removing materials from a substrate, comprising:
   a. providing an assembly including polymeric microstructures that include microstructure heads supported by stems, wherein each microstructure head defines a microfibril tip and a side of the microfibril, wherein the microfibril tip is of lesser diameter than the supporting stem, and wherein the microstructure heads of the polymeric microstructures have diameters of at least 2 µm;
   b. contacting the microfibril tips of the assembly with a surface of a substrate in a direction that is normal to the surface of the substrate;
   c. removing a plurality of contaminant particles from the surface of the substrate based on contact of the polymeric microstructures with the contaminant particles, said removal being in a direction that is normal to the surface of the substrate;
      wherein removal of the plurality of contaminant particles from the surface of the substrate includes initially associating a first contaminant particle with the microfibril tip and subsequently moving the first contaminant particle to the side of the microfibril based on contact of the microfibril tip with one or more additional contaminant particles from among the plurality of contaminant particles.

2. The method of claim 1, wherein the plurality of contaminant particles are removed from the surface of the substrate without damage to the surface of the substrate.

3. The method of claim 1, wherein the plurality of contaminant particles include at least one of micrometric and sub-micrometric particles.

4. The method of claim 1, wherein the plurality of contaminant particles are removed from the surface of the substrate by establishing interfacial interactions between the plurality of contaminant particles and the polymeric microstructures.

5. The method of claim 4, wherein the interfacial interactions are sufficiently strong to separate the plurality of contaminant particles from the surface of the substrate.

6. The method of claim 1, wherein the substrate has utility in one or more of the following fields: microelectronics, aerospace, optics, xerography, medical and art applications.

7. The method of claim 1, wherein the assembly is formed, in whole or in part, from an elastic and low-surface energy polymeric material.

8. The method of claim 1, wherein the polymeric microstructures establish intimate contact with both the plurality of contaminant particles and the surface of the substrate.

9. The method of claim 8, wherein the intimate contact between the polymeric microstructures and the surface of the substrate imparts essentially no physical effect to the surface of the substrate.

10. The method of claim 1, wherein the plurality of polymeric microstructures define spaces or openings between individual polymeric microstructures, and wherein the movement of the first contaminant particle to the side of the microfibril is effective to position the first contaminant particle in a space or opening defined between individual polymeric microstructures.

11. The method of claim 1, wherein the movement of the first contaminant particle to the side of the polymeric microfibril reduces damage to the surface of the substrate based on contact between the plurality of contaminant particles associated with the polymeric microstructures and the surface of the substrate.

12. The method of claim 1, wherein the movement of the first contaminant particle to the side of the polymeric microfibril increases contaminant particle removal by allowing the polymeric microstructures to remove the one or more additional contaminant particles from the surface of the substrate.

13. The method of claim 1, wherein the polymeric microstructures are fabricated from polydimethylsiloxane.

14. The method of claim 1, wherein the adhesion force between the polymeric microstructures and the plurality of contaminant particles is greater than the adhesion force between the plurality of contaminant particles and the surface of the substrate.

15. The method of claim 14, wherein the adhesion force between the polymeric microstructures and the plurality of contaminant particles is at least about five (5) times greater than the adhesion force between the plurality of contaminant particles and the surface of the substrate.

16. The method of claim 1, wherein the microstructure heads are characterized by diameters that are no more than eight (8) times greater than the diameters of the plurality of contaminant particles.

17. The method of claim 1, wherein the polymeric microstructures are coated with a material that enhances generation of contact electrification (CE) forces by the polymeric microstructures.

18. The method of claim 17, wherein the polymeric microstructures are coated with a fluorine-based silane coupling agent.

19. The method of claim 18, wherein the fluorine-based silane coupling agent is perfluorooctyltrichlorosilane.

20. The method of claim 1, wherein the assembly contacts the surface of the substrate by way of a tapping action.

21. A method for removing materials from a substrate, comprising:
   a. providing an assembly including polymeric microstructures that include microstructure heads supported by stems, wherein the microstructure heads define flat tips and rounded edges, wherein the microstructure heads of the polymeric microstructures have diameters of at least 2 μm;
   b. contacting the flat tips of the assembly with a surface of a substrate in a direction that is normal to the surface of the substrate;
   c. removing a plurality of contaminant particles from the surface of the substrate based on contact of the polymeric microstructures with the contaminant particles, said removal being in a direction that is normal to the surface of the substrate;
      wherein removal of the plurality of contaminant particles from the surface of the substrate includes initially associating a first contaminant particle with the flat tip of the microstructure head and subsequently moving the first contaminant particle to a side of the microstructure head based on contact of the flat tip with one or more additional contaminant particles from among the plurality of contaminant particles.

22. The method of claim 1, wherein the microstructure heads of the polymeric microstructures have diameters of between 2 μm and 50 μm.

23. The method of claim 21, wherein the microstructure heads of the polymeric microstructures have diameters of between 2 μm and 50 μm.

* * * * *